(12) United States Patent
Norconk et al.

(10) Patent No.: US 11,987,508 B2
(45) Date of Patent: May 21, 2024

(54) WATER TREATMENT SYSTEM

(71) Applicant: Access Business Group International LLC, Ada, MI (US)

(72) Inventors: Matthew J. Norconk, Grand Rapids, MI (US); Ted Robbins, Ada, MI (US); Ziqi Wu, Grand Rapids, MI (US); Joshua B. Taylor, Rockford, MI (US)

(73) Assignee: Access Business Group International LLC, Ada, MI (US)

( * ) Notice: Subject to any disclaimer, the term of this patent is extended or adjusted under 35 U.S.C. 154(b) by 82 days.

(21) Appl. No.: 17/568,953

(22) Filed: Jan. 5, 2022

(65) Prior Publication Data

US 2023/0212038 A1 Jul. 6, 2023

(51) Int. Cl.
*C02F 1/32* (2023.01)
*C02F 1/02* (2023.01)

(52) U.S. Cl.
CPC ............ *C02F 1/325* (2013.01); *C02F 1/02* (2013.01); *C02F 2201/002* (2013.01); *C02F 2201/3222* (2013.01); *C02F 2303/04* (2013.01); *C02F 2307/06* (2013.01)

(58) Field of Classification Search
CPC .... C02F 1/32; C02F 1/00; H05K 1/02; H05K 7/20; A61L 2/10; A61L 9/20
See application file for complete search history.

(56) References Cited

U.S. PATENT DOCUMENTS

| 8,172,434 | B1 | 5/2012 | Olsson |
| 10,829,394 | B2 * | 11/2020 | Taghipour .......... H05K 7/20272 |
| 2020/0230270 | A1 | 7/2020 | Taghipour |
| 2021/0032127 | A1 * | 2/2021 | Wu .......................... C02F 1/325 |

FOREIGN PATENT DOCUMENTS

| CN | 201382623 Y | * | 1/2010 | |
| CN | 109265654 A | * | 1/2019 | ............. B32B 15/14 |
| KR | 2020-0030619 | | 3/2020 | |
| WO | WO-2005091811 A2 | * | 10/2005 | .......... B41M 7/0081 |

OTHER PUBLICATIONS

CN-201382623-Y Translation (Year: 2010).*
CN-109265654-A- translation (Year: 2019).*

* cited by examiner

*Primary Examiner* — Walter D. Griffin
*Assistant Examiner* — Cameron J Allen
(74) *Attorney, Agent, or Firm* — Warner Norcross + Judd LLP

(57) ABSTRACT

A UV reactor for disinfecting water and including a UV source printed circuit board assembly transfers heat to a heat sink in the form of a water facing thermal coupler. The UV source printed circuit board assembly may include a metal clad printed circuit board having a thermal contact region in thermal communication with the heat sink.

26 Claims, 14 Drawing Sheets

WATER TREATMENT SYSTEM

FIELD OF INVENTION

The present disclosure relates to a water treatment system, and more particularly toward a point-of-use water treatment system for a residential or commercial application.

BACKGROUND

Conventional water treatment systems are often used to treat water intended for human consumption. Such treatment systems can be configured to remove pathogens, chemical contaminants and turbidity from water. Many conventional treatment methods can be broadly classified as either solid separation using physical processes and/or chemical processes or as sterilization using heat, irradiation or chemical additives. For example, conventional water treatment systems often include carbon filtration, non-carbon filtration, distillation, ozone treatment, reverse osmosis, ion exchange components, chlorination components, aeration components, advanced oxidation process components, coagulation components, sedimentation components, or ultraviolet radiation components.

Conventional point-of-use water treatment systems are designed for use at a single water outlet, such as a sink or water dispenser. The conventional point-of-use water treatment system is connected to a pressurized water supply to treat water as it is being dispensed. In some applications, the water treatment system is positioned on a countertop adjacent to a sink. In countertop applications, the water treatment system is often times connected to the end of the water faucet so that water exiting the faucet can be routed through the water treatment system before it is dispensed.

In some conventional point-of-use water treatment systems, ultraviolet (UV) energy can be used to substantially disinfect fluids. Exposure to ultraviolet light is believed to detrimentally alter the genetic (DNA) material in cells, thereby reducing the population of potentially pathogenic microorganisms such as bacteria, viruses, molds, algae and the like. Typically, water flows past UV lamps in UV disinfection systems thereby exposing microorganisms in the water to a dose of UV energy sufficient to substantially neutralize the microorganism. Typical water disinfection systems and devices emit UV light at approximately 254 nm, which is believed to penetrate the outer cell membrane of microorganisms, pass through the cell body, reach the DNA, and alter the genetic material of the microorganism.

In some cases, the UV light emitting diodes (UV-LEDs) provided in conventional UV disinfection systems generate heat during operation. This heat can sometimes be detrimental to the operating life of the UV-LEDs. To dissipate such heat, conventional UV disinfection systems utilize convection cooling in conjunction with the surrounding air. A metal heat sink may be provided that facilitates transfer of heat to the surrounding air. These types of cooling systems can be ineffective, particularly in confined spaces where air flow is minimal, such as when the system is installed in a cabinet under a sink.

Conventional UV reactors for water treatment systems rely on inefficient heat transfer configurations. For instance, conventional UV reactors utilize conventional FR4 printed circuit board assemblies along with a heat sink mounted in one of two ways. 1) a heat sink may be mounted directly to a component being cooled. Sometimes this involves a mechanical support connection to a board or chassis and a thermal connection to the component, both of which add cost. 2) If the component itself does not allow direct mounting of a heat sink, additional solder pads can be placed near the component where a heatsink can be soldered to an outer layer of the printed circuit board.

SUMMARY

A UV reactor for disinfecting water is provided. In general, one innovative aspect of the subject matter described herein can be embodied in an ultraviolet (UV) reactor for irradiating a flow of water with UV radiation. The UV reactor may include a treatment assembly including a water inlet and a water outlet, where the treatment assembly may be operable to direct water received via the water inlet toward a point-of-use downstream from the water outlet. The UV reactor may include a printed circuit board (PCB) including a first substrate, a heat conducting substrate, and a dielectric disposed between the first substrate and the heat conducting substrate. The first substrate may include a first surface with a circuit region.

The UV reactor in one embodiment may include a UV light emitting diode (UV-LED) operatively connected to the PCB, where the UV-LED may be oriented for directing UV energy into the treatment assembly.

A thermal contact region of the heat conducting substrate may be exposed such that the thermal contact region is devoid of the dielectric and the first substrate, where the thermal contact region is in thermal communication with water flowing through the UV reactor.

The foregoing and other embodiments can each optionally include one or more of the following features, alone or in combination. In particular, one embodiment includes all the following features in combination.

In some embodiments, the UV reactor may include a thermally conductive material with a fluid contact surface arranged to define at least a portion of a fluid path of the water flowing through the UV reactor. The thermally conductive material may be thermally coupled to the thermal contact region of the heat conducting substrate to facilitate thermal communication between water flowing through the UV reactor and the thermal contact region.

In some embodiments, the thermal contact region may be thermally coupled to water flowing through the UV reactor via the thermally conductive material.

In some embodiments, a thermally conductive intermediate material may be provided between the thermal contact region and the thermally conductive material to facilitate thermal communication between water flowing through the UV reactor and the thermal contact region.

In some embodiments, the fluid contact surface of the thermally conductive material may be disposed downstream of the treatment assembly.

In some embodiments, the treatment assembly may include a water treatment chamber having a first end and a second end with a longitudinal axis extending therebetween. The water treatment chamber may include a chamber inlet in fluid communication with the water inlet to receive water to be decontaminated and include a plurality of chamber outlets operable to direct water substantially non-parallel to the longitudinal axis of the water treatment chamber.

The UV-LED may be configured to provide UV energy to the water treatment chamber, where the UV energy may be directed substantially parallel to the longitudinal axis of the water treatment chamber.

A cooling chamber may be in fluid communication with the plurality of chamber outlets of the water treatment chamber. The cooling chamber may be in thermal communication with the UV-LED to facilitate transfer of thermal energy from the UV-LED to water in fluid communication with the water outlet. The cooling chamber may be operable to direct water to the water outlet.

In some embodiments, the fluid contact surface defines at least a portion of a fluid path of the cooling chamber.

In some embodiments, the UV reactor may include a reactor body with a reactor body inlet opening and a reactor body outlet opening. The UV reactor may include a top cap disposed on the reactor body outlet opening and including the cooling chamber and the UV-LED.

The top cap may include a UV transmissive window disposed to facilitate formation of a water tight seal between the UV-LED and the water treatment chamber. The UV transmissive window may include a water chamber side and a UV source side, and may be positioned to facilitate transmission of UV light from the UV-LED to the water treatment chamber.

The top cap may include an interior support surface operable to support the water chamber side of the UV transmissive window in position relative to the UV-LED;

The top cap may include a plurality of outlet channels, each of which forms at least a portion of each of the plurality of chamber outlets.

The cooling chamber may be disposed to be in direct fluid communication with each of the plurality of chamber outlets. The cooling chamber may be defined at least by an outlet collection trough, the UV transmissive window, and the thermally conductive material.

In some embodiments, the cooling chamber may at least partially surround the reactor body outlet opening.

In some embodiments, the PCB may be a metal clad printed circuit board.

In some embodiments, the UV-LED may be disposed on the first surface of the first substrate.

In some embodiments, a solder mask may be disposed on the first surface of the first substrate.

In some embodiments, the upper and lower surfaces of the heat conducting substrate may be entirely devoid of a solder mask.

In some embodiments, the heat conducting substrate may include an upper surface that defines the thermal contact region.

In some embodiments, an extension of the heat conducting substrate may extend from a primary surface of the heat conducting substrate on which the dielectric is disposed. The extension may include the upper surface. A plane of the first substrate may intersect the extension.

In some embodiments, the first substrate and the dielectric may define a first edge. The heat conducting substrate may be disposed adjacent to the first edge and extends from both sides of the first edge, such that the thermal contact region is disposed proximal to one side of the first edge and the heat conducting substrate is bonded to the dielectric proximal to the other side of the first edge.

In general, one innovative aspect of the subject matter described herein can be embodied in a water treatment system for treating water. The water treatment system may include a treatment assembly inlet and a treatment assembly outlet, where the treatment assembly inlet may be operable to receive water, and the treatment assembly outlet may be operable to discharge water from the water treatment system.

The water treatment system may include a printed circuit board (PCB) including a first substrate, a heat conducting substrate, and a dielectric disposed between the first substrate and the heat conducting substrate. The first substrate may include a first surface with a circuit region. A thermal contact region of the heat conducting substrate may be exposed such that the thermal contact region is devoid of the dielectric and the first substrate. A UV source may be operably connected to the circuit region of the printed circuit board, where the UV source may be configured to provide UV energy for disinfection of water.

The water treatment system may include a UV reactor configured to facilitate disinfection of water via application of UV energy to water flowing through the UV reactor. The UV reactor may include a water inlet operably coupled to the treatment assembly inlet to receive water, and a water outlet for discharging water from the UV reactor. The UV reactor may include a water treatment chamber having a first end and a second end with a longitudinal axis extending therebetween, where the water treatment chamber may include a chamber inlet in fluid communication with the water inlet to receive water to be decontaminated. The water treatment chamber may include a plurality of chamber outlets operable to direct water substantially non-parallel to the longitudinal axis of the water treatment chamber, where the UV source is arranged to provide UV energy to the water treatment chamber in a direction substantially parallel to the longitudinal axis. The UV reactor may include a cooling chamber in fluid communication with the plurality of chamber outlets of the water treatment chamber, where the cooling chamber may be in thermal communication with the thermal contact region of the heat conducting substrate to facilitate transfer of thermal energy from the UV source to water in fluid communication with the water outlet. The cooling chamber may be operable to direct water to the water outlet.

The foregoing and other embodiments can each optionally include one or more of the following features, alone or in combination. In particular, one embodiment includes all the following features in combination.

In some embodiments, the water treatment system may include a thermally conductive material with a fluid contact surface arranged to define at least a portion of a fluid path of the water flowing through the water treatment system. The thermally conductive material may be thermally coupled to the thermal contact region of the heat conducting substrate to facilitate thermal communication between water flowing through the water treatment system and the thermal contact region.

In some embodiments, the thermal contact region may be thermally coupled to water flowing through the water treatment system via the thermally conductive material.

In some embodiments, a thermally conductive intermediate material may be provided between the thermal contact region and the thermally conductive material to facilitate thermal communication between water flowing through the UV reactor and the thermal contact region.

In some embodiments, the fluid contact surface of the thermally conductive material may be disposed downstream of the water treatment chamber.

In some embodiments, the water treatment system comprises a reactor body with a reactor body inlet opening and a reactor body outlet opening. The water treatment system may include a top cap disposed on the reactor body outlet opening and including the cooling chamber and the UV source.

The top cap may include a UV transmissive window disposed to facilitate formation of a water tight seal between the UV source and the water treatment chamber. The UV transmissive window may include a water chamber side and a UV light source side. The UV transmissive window may be positioned to facilitate transmission of UV light from the UV source to the water treatment chamber. The top cap may include an interior support surface operable to support the water chamber side of the UV transmissive window in position relative to the UV source. The top cap may include a plurality of outlet channels, each of which forms at least a portion of a chamber outlet of the plurality of chamber outlets.

The cooling chamber may be disposed to be in direct fluid communication with each of the plurality of chamber outlets, where the cooling chamber may be defined at least by an outlet collection trough, the UV transmissive window, and the thermally conductive material.

In some embodiments, the cooling chamber may at least partially surround the reactor body outlet opening.

In some embodiments, the PCB may be a metal clad printed circuit board.

In some embodiments, the UV source may be disposed on the first surface of the first substrate.

In some embodiments, a solder mask may be disposed on the first surface of the first substrate.

In some embodiments, the upper and lower surfaces of the heat conducting substrate may be entirely devoid of a solder mask.

In some embodiments, the heat conducting substrate may include an upper surface that defines the thermal contact region.

In some embodiments, the heat conducting substrate may include a lower surface that defines the thermal contact region. This thermal contact region may thermally couple to a heat sink, such as a heat sink described herein or an alternatively configured heat sink, such as a heat sink including a different geometry relative to one or more heat sinks depicted in the illustrated embodiments (e.g., where a stainless steel heatsink contacts the lower surface of the heat conducting substrate or both the upper and lower surfaces of the heat conducting substrate).

In some embodiments, an extension of the heat conducting substrate may extend from a primary surface of the heat conducting substrate on which the dielectric is disposed. The extension may include the upper surface. A plane of the first substrate may intersect the extension.

In some embodiments, the first substrate and the dielectric may define a first edge, where the heat conducting substrate may be disposed adjacent to the first edge and extend from both sides of the first edge, such that the thermal contact region is disposed proximal to one side of the first edge and the heat conducting substrate is bonded to the dielectric proximal to the other side of the first edge.

In general, one innovative aspect of the subject matter described herein can be embodied in a method of disinfecting water. The method may include providing a treatment assembly including a water inlet and a water outlet, and directing water through the treatment assembly from the water inlet to the water outlet toward a point-of-use downstream from the water outlet. The method may include providing a UV source connected to a circuit region of a printed circuit board (PCB), where the PCB includes a first substrate, a heat conducting substrate, and a dielectric disposed between the first substrate and the heat conducting substrate, and where the first substrate includes a first surface with the circuit region. A thermal contact region of the heat conducting substrate may be exposed such that the thermal contact region is devoid of the dielectric and the first substrate. The method may include conducting heat from the UV source to the thermal contact region of the PCB, and conducting heat from the thermal contact region of the PCB to water flowing toward the water outlet.

The foregoing and other embodiments can each optionally include one or more of the following features, alone or in combination. In particular, one embodiment includes all the following features in combination.

In some embodiments, the PCB may be a metal clad printed circuit board.

In some embodiments, the method may include supplying UV energy from the UV source to water flowing through the treatment assembly.

Before the embodiments of the invention are explained in detail, it is to be understood that the invention is not limited to the details of operation or to the details of construction and the arrangement of the components set forth in the following description or illustrated in the drawings. The invention may be implemented in various other embodiments and of being practiced or being carried out in alternative ways not expressly disclosed herein. Also, it is to be understood that the phraseology and terminology used herein are for the purpose of description and should not be regarded as limiting. The use of "including" and "comprising" and variations thereof is meant to encompass the items listed thereafter and equivalents thereof as well as additional items and equivalents thereof. Further, enumeration may be used in the description of various embodiments. Unless otherwise expressly stated, the use of enumeration should not be construed as limiting the invention to any specific order or number of components. Nor should the use of enumeration be construed as excluding from the scope of the invention any additional steps or components that might be combined with or into the enumerated steps or components.

DETAILED DESCRIPTION

Figure 1:
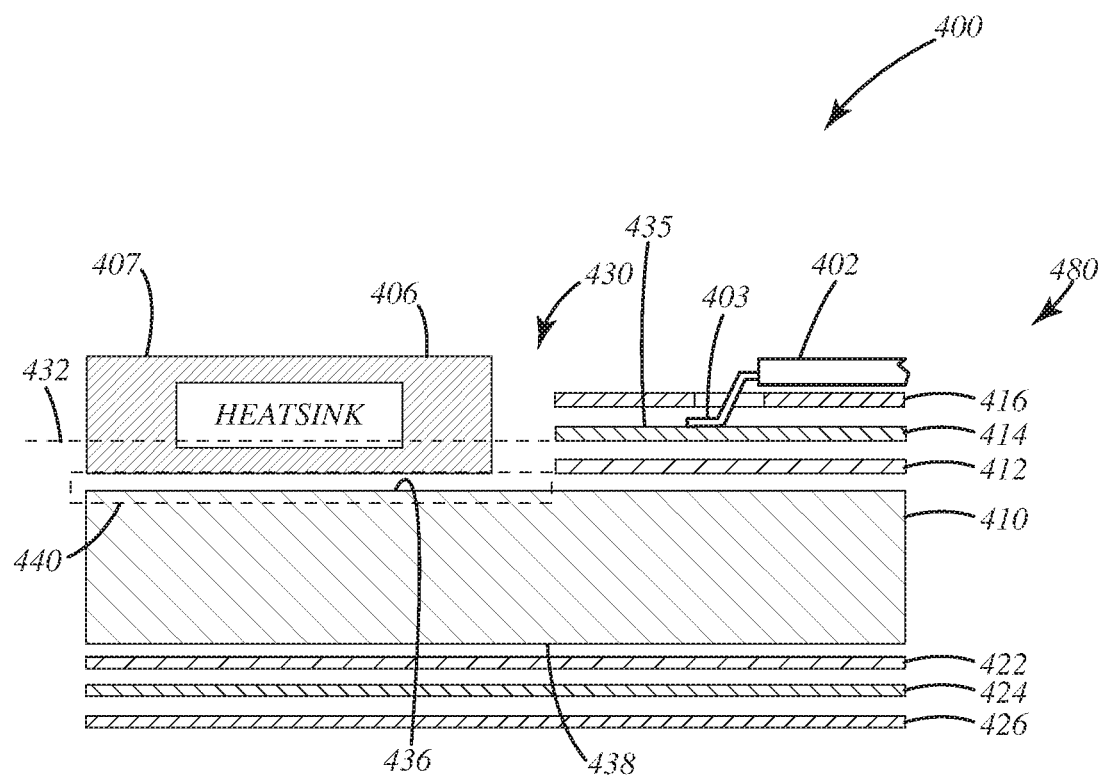
FIG. 1 shows a printed circuit board assembly along with a heat sink in accordance with one embodiment.

A UV reactor is provided for disinfecting water and includes a UV source printed circuit board assembly that is configured to transfer heat to a heat sink in the form of a water facing thermal coupler. The UV source printed circuit board assembly may include a metal clad printed circuit board having a thermal contact region in thermal communication with the heat sink.

In one embodiment, a connection may be provided between a metal-clad PCB, or similar board with a thermally conductive inner layer, and parts that are mounted on the metal-clad PCB. The parts may produce heat that the metal-clad PCB may conduct through one or more intermediary materials or layers into a heat removal material (e.g., air or water).

In a conventional FR4 PCB, the core is fiberglass, not electrically conductive and not a good thermal conductor, so the majority of the heat flux is provided in the outer (thin) copper layer(s). For this reason, to remove heat from the FR4 PCT, a heatsink is often thermally coupled to the outer copper layers of the board.

In contrast to a conventional FR4 PCB, one embodiment according to the present disclosure may include metal-clad board PCB that includes three conductive layers: top and bottom copper layers as well as a core layer (e.g., copper or aluminum core). For a metal-clad PCB, the core may be provided because the core provides significantly greater thermal conductivity than top and bottom layers to the point where, in one embodiment, thermal pads of components (e.g., LEDs) may be soldered directly to the core layer rather than to the top or bottom layers. For enhanced heat transfer to a board mounted heatsink, this heatsink may be directly coupled to the core layer as well.

In one embodiment, components may be soldered to the outer layers (e.g., the top or bottom layer) of the metal-clad PCB. This arrangement may dispose one or more additional, and potentially insulating layers between the heatsink and a primary heat carrier. This arrangement with the components soldered to the top or bottom layer of the metal-clad PCB may be less efficient for thermal transfer of heat relative to embodiments where the components are soldered directly to the core layer; however, in either case, thermal conduction efficiency is significantly greater than the conventional FR4 PCB arrangement.

A metal-clad PCB in accordance with one embodiment may include board with a solder mask absent from the core layer, including a portion of the core layer that is exposed in accordance with one or more embodiments described herein. The outer conductive layer may or may not include a soldermask. The outer conductive layer may be thermally coupled to the core layer via a dielectric layer having a high thermal conductance. The core layer may be the primary heat carrying layer, such that the additional layers (e.g., the outer conductive layer and the dielectric), in addition to the soldermask, may be considered more insulating rather than facilitating heat transfer.

In one embodiment, a metal clad PCB may be structured for removal of (or not placement, depending on manufacturing process) additional layers, which would otherwise be between the heatsink and a core layer (e.g., a copper core layer).

In one embodiment, a core layer of the metal clad PCT may be assigned to an electrical net that can be common to all electrical components, which are scheduled for active cooling through a heatsink. This may be the ground net; however, the core layer may be assigned to some other net or a floating net which is not electrically connected. Components scheduled for thermal transfer may then be soldered directly to the core material. A heatsink may be connected, via mechanical contact, thermal compound, soldering or other method to the same core material.

In one embodiment, LEDs provided as UV sources may include a thermal pad, which may be connected to the core layer. A heatsink may be connected to the core layer either mechanically (metal-to-metal contact) or with thermal compound.

In alternative embodiments, the LEDs may not have a thermal pad, but instead utilize a specific pin, pad, or net connected to the die for heat transfer. In this case, the core layer may be tied to that specific pin, pad, or net.

In one embodiment, if the heatsink is not connected to the net being used as a thermal connection for the components in question, the dielectric layer for a metal-clad board could be left in place, and heat flux may be flow from the net to the outer conductive layer and through the dielectric layer to the core layer.

In one embodiment, the components being cooled and the heatsink connection may be provided on the same side of the metal-clad PCB. Alternatively, the components and heatsink may be provided on opposing sides of a double-sided PCB, with the PCT stackup including two dielectric layers, two copper layers and a silkscreen layer between the component thermal pad and the heatsink. In one embodiment, by eliminating all layers except for the core layer between the component and the heatsink, mounting the heatsink to either component side or the opposite side of the core layer may incur no additional losses to the heat-flux.

I. Water Treatment System Overview

Figure 4:
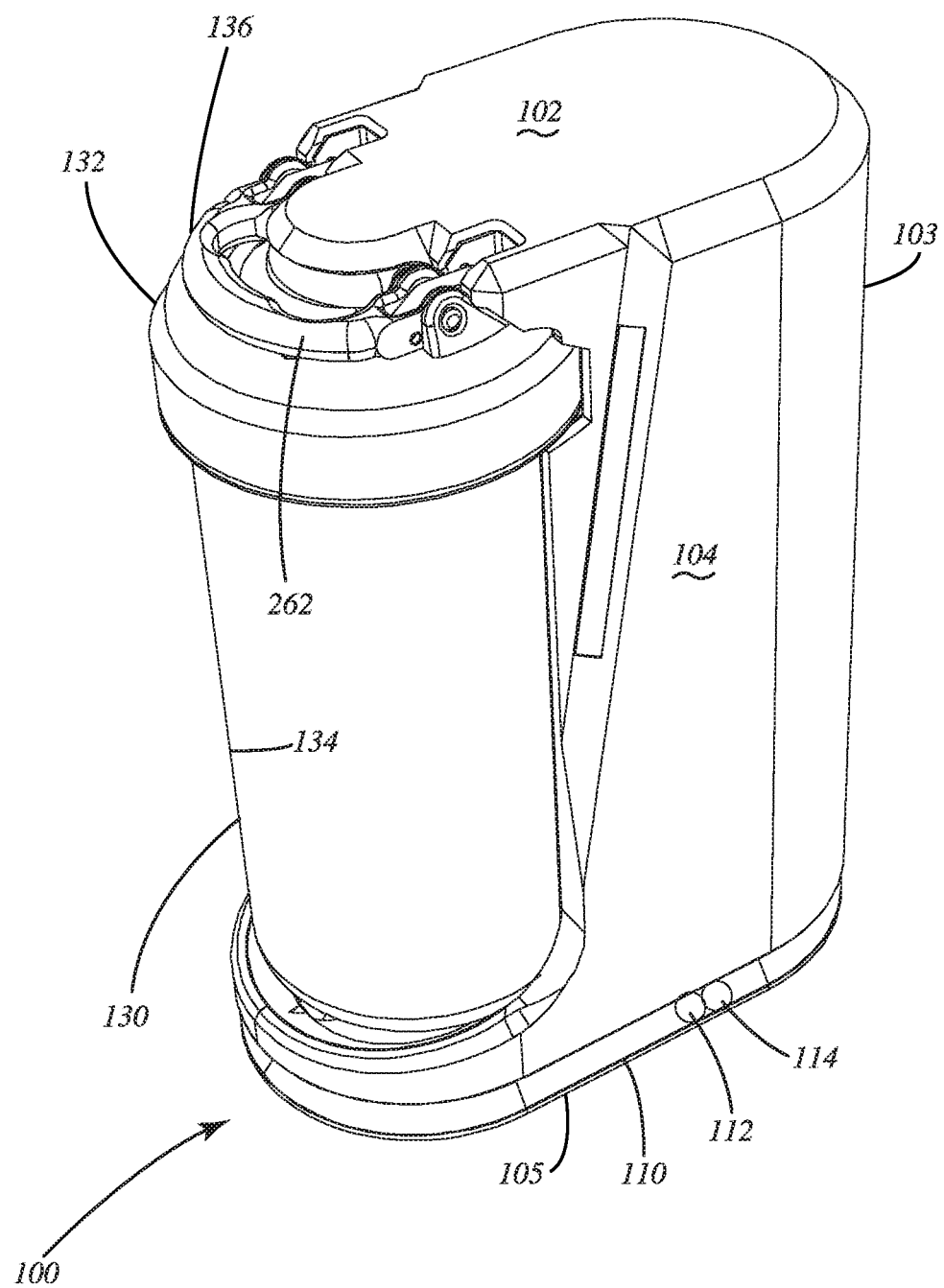
FIG. 4 shows a perspective view of a water treatment system in accordance with one embodiment.
Figure 5:
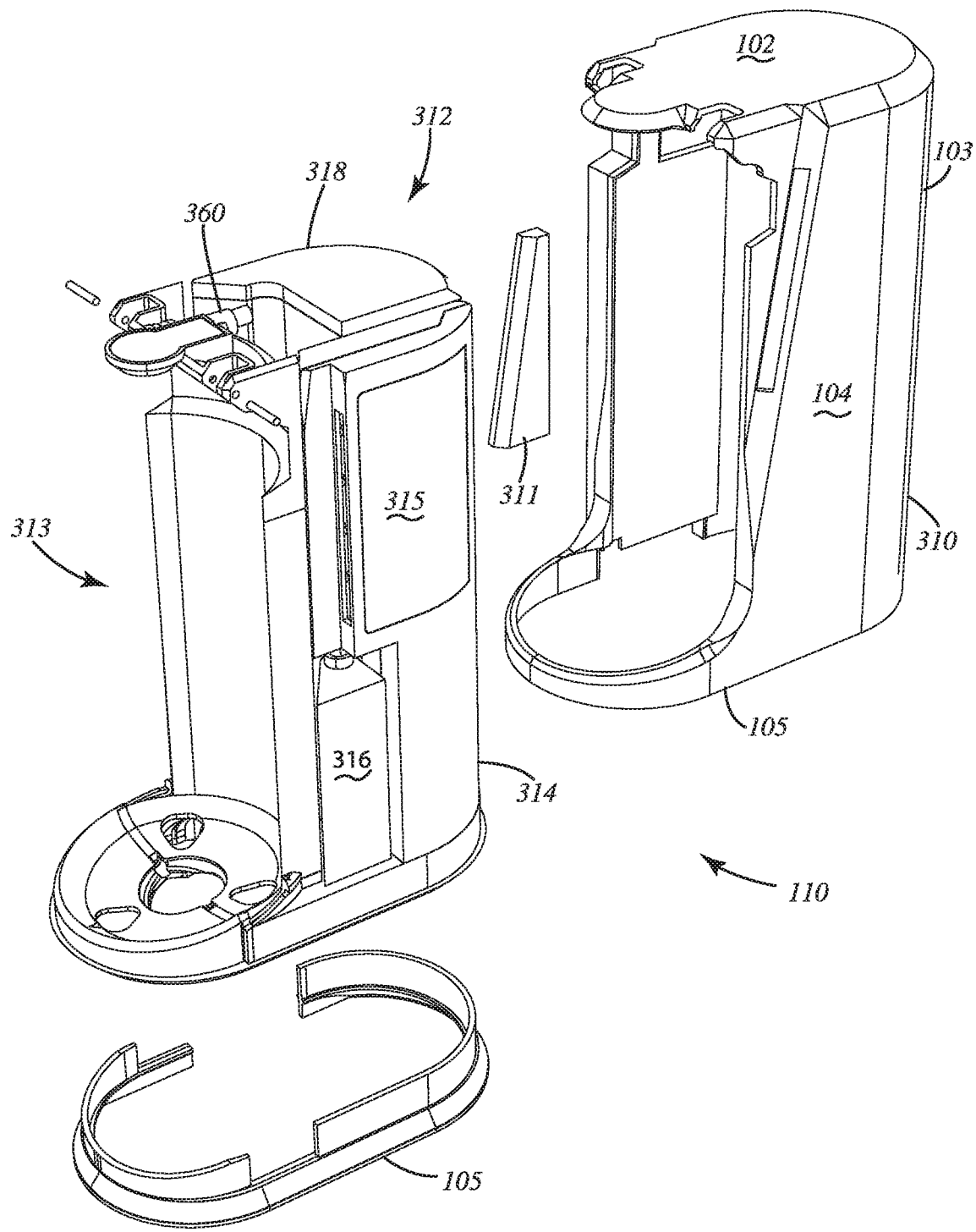
FIG. 5 shows an exploded view of the water treatment system of FIG. 1.
Figure 6:
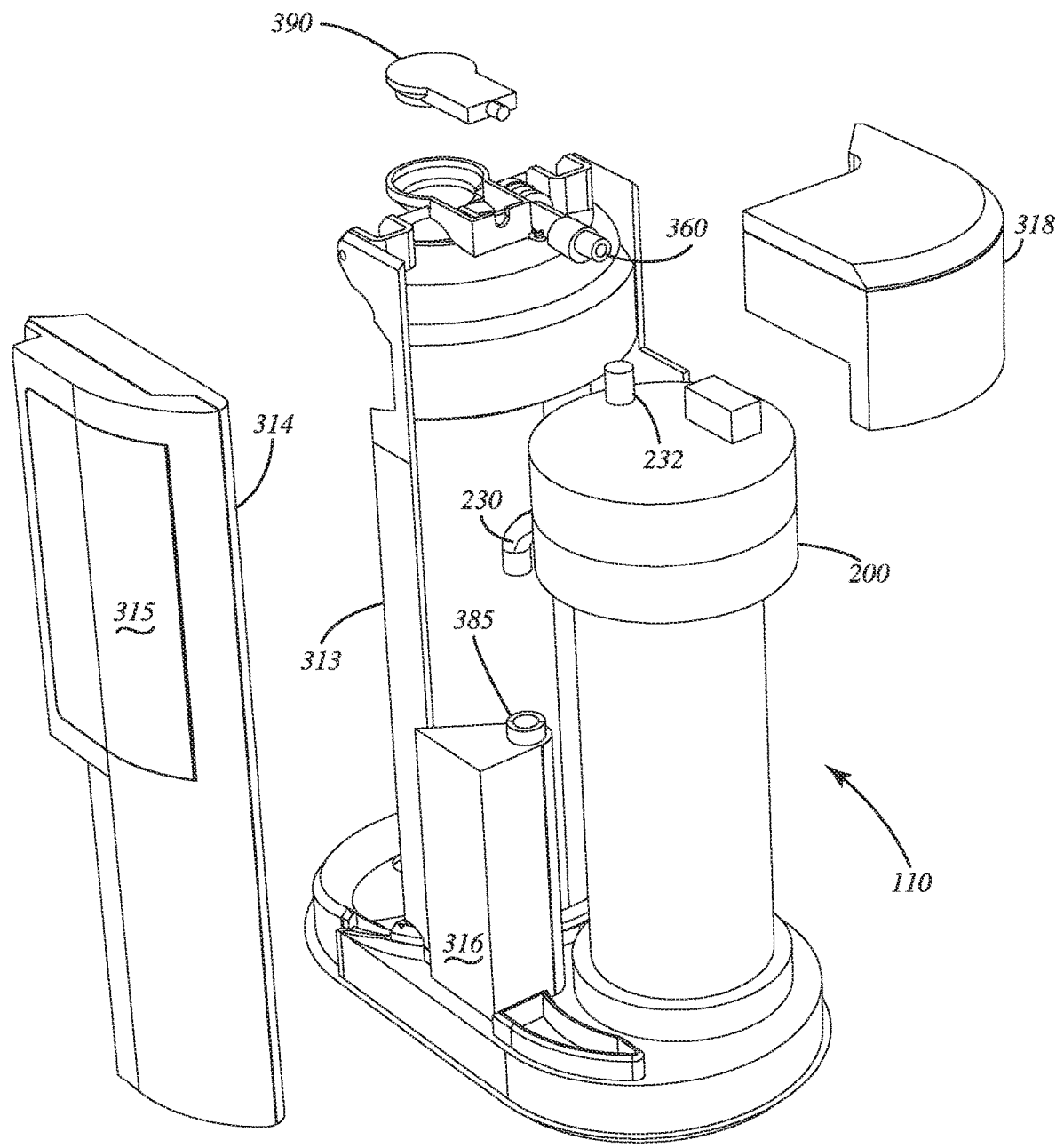
FIG. 6 shows an exploded view of the water treatment system of FIG. 1.
Figure 7:
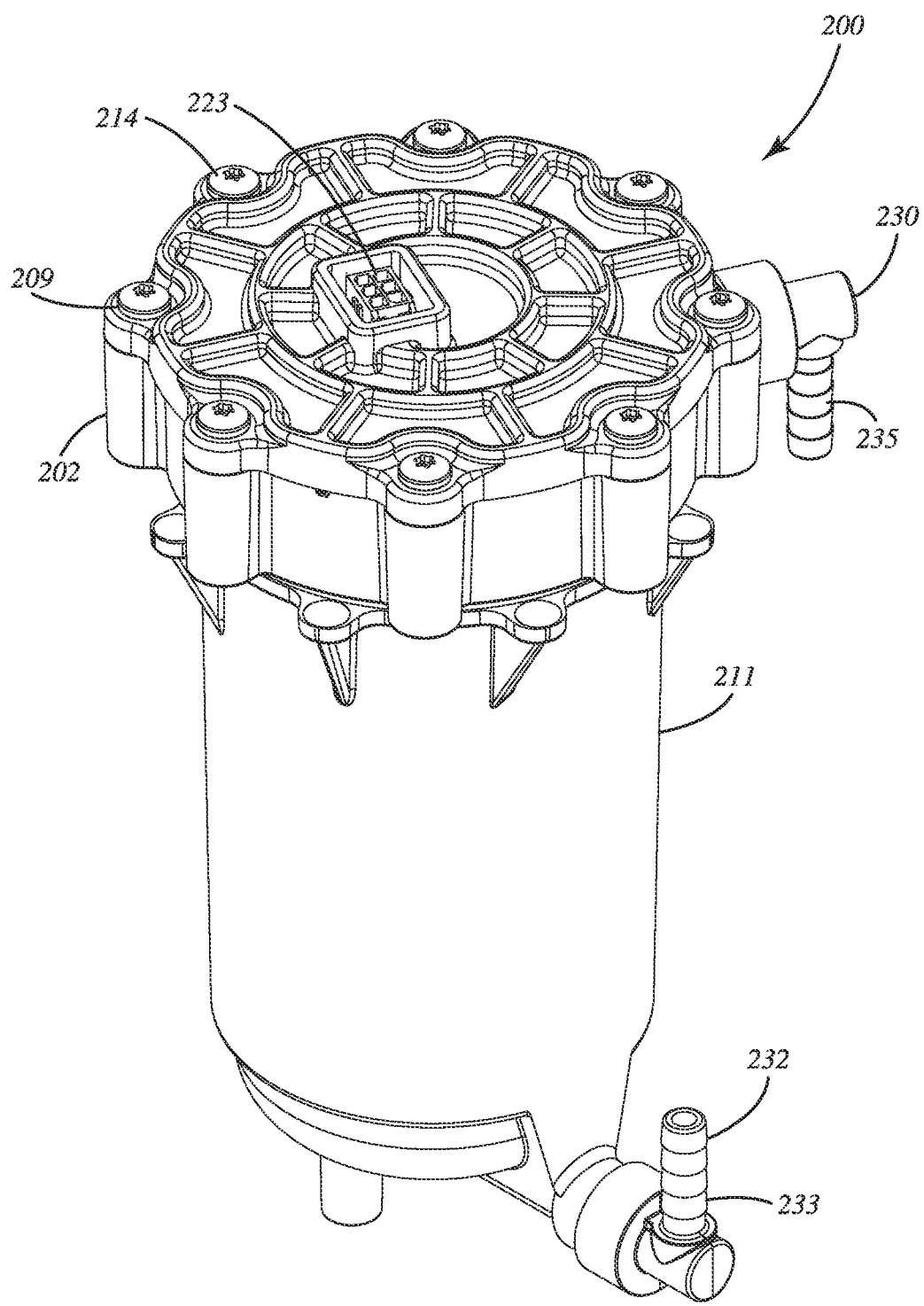
FIG. 7 shows a perspective view of a UV reactor in accordance with one embodiment.
Figure 8:
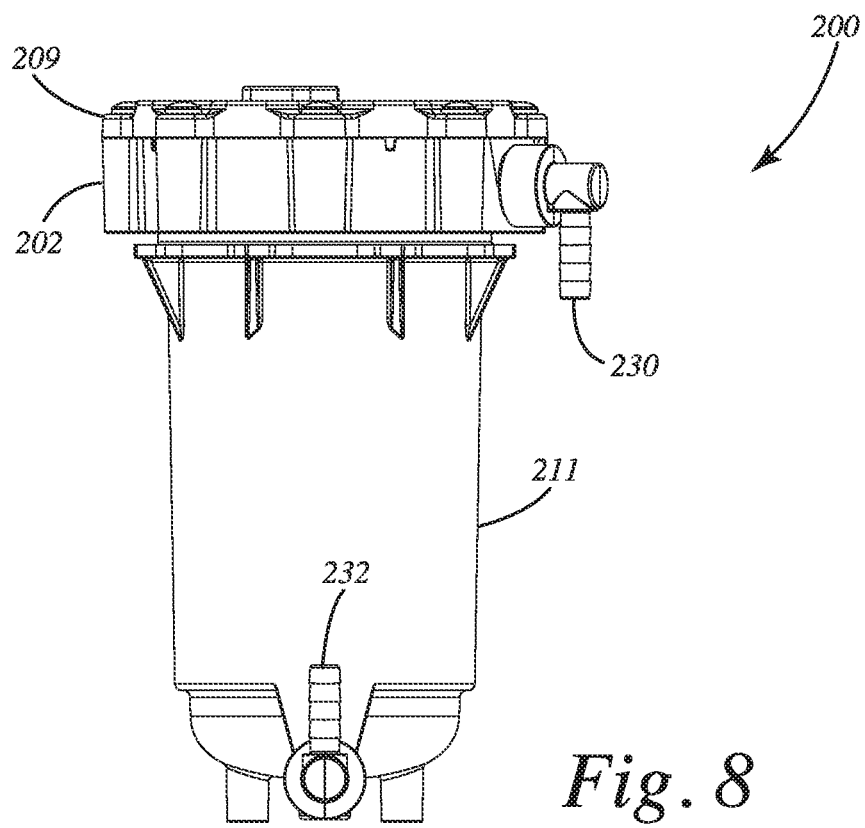
FIG. 8 shows a side view of the UV reactor of FIG. 1.
Figure 9:
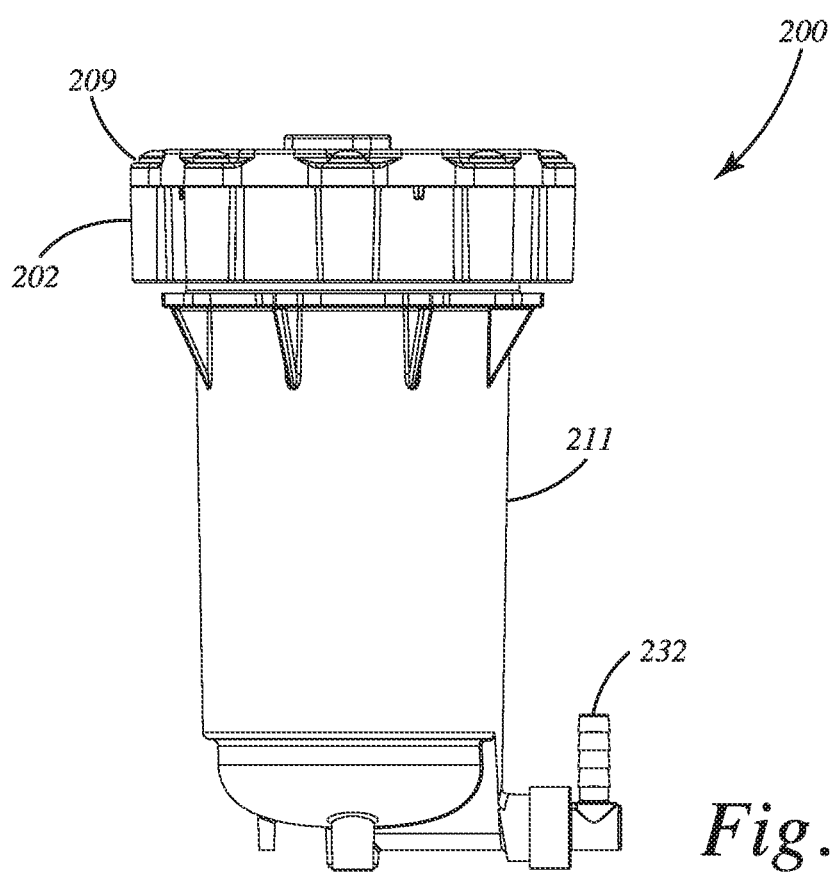
FIG. 9 shows another side view of the UV reactor of FIG. 1.

A water treatment system 100 in accordance with one embodiment of the present disclosure is shown in FIGS. 4-6 and generally designated 100. The water treatment system 100 in the illustrated embodiment includes a treatment assembly 130 and a base assembly 110. The water treatment system 100 may include a removable cover (not shown) configured to interface with the base assembly 110 to conceal one or more or all aspects of the treatment assembly 130. In one embodiment, the removable cover may conceal the treatment assembly 130 to provide an aesthetic appeal to the water treatment system 100 for positioning the water treatment system 100 on a countertop or visible during daily use.

The removable cover may provide a separable aesthetic shell structure that enables updates or changes to form, material, and color to the water treatment system 100. For instance, the removable cover in one application may be replaced with another removable cover with one or more different aspects related to form, material, or color, or a combination thereof.

In one embodiment, the water treatment system 100 may include UV disinfection capabilities. The water treatment system 100 may include a UV disinfection assembly or UV reactor 200, described herein, that provides such UV disinfection capabilities. The UV reactor 200, in one embodiment, may include a long life/permanent LED reactor assembly installed in a position within the base assembly 110.

The treatment assembly 130 in the illustrated embodiments of FIGS. 4-6 may be removable from the base assembly 110 in a manner that facilitates storage or placement of the water treatment system 100 for operation in a space that limits access to one or more sides or portions of the water treatment system 100, such as an upper portion 102, a rear portion 103, a side portion 104, or a base portion 105, or a combination thereof. As an example, a space between the upper portion 102 and another object such as an upper cabinet, may be sufficiently small such that there is limited access to the upper portion 102 or limited vertical displacement of one or more components of the water treatment system 100 (e.g., the treatment assembly 130). In one embodiment, the water treatment system 100 may be considered to incorporate a 'flat' aspect ratio that preserves usable work space in on-counter installations and substantially minimizes storage space intrusion in below counter placements.

An example water treatment construction is described in further detail in U.S. Appl. No. 62/839,145, entitled WATER TREATMENT SYSTEM, filed Apr. 26, 2019, to Lautzenheiser et al. and U.S. application Ser. No. 16/857,253, entitled WATER TREATMENT SYSTEM, filed Apr. 24, 2020, to Lautzenheiser et al.—the disclosures of which are hereby incorporated by reference in their entirety.

In one embodiment, the removable cover may engage and disengage from the base assembly 110 in a direction substantially parallel with a surface upon which the base assembly 110 is disposed. This way, the removable cover may facilitate access to the treatment assembly 130 while the water treatment system 100 is positioned in a space-constrained position as described herein, which may restrict access to the water treatment system 100 along one or more sides or portions thereof.

The water treatment system 100 may be operable to receive, via a water inlet tube 112, untreated water from a source, such as a cold water service line configured to supply water under pressure. The water treatment system 100 may also be operable to treat the untreated water received from the source and deliver treated water to a water outlet tube 114, which may be coupled to a faucet to deliver the treated water to a point-of-use. In one embodiment, the water connections for inlet and outlet piping or tubes are housed or provided in a space under the unit that is accessible to an installer. The connectors may provide rotation capabilities to align system parts during installation.

The treatment assembly 130 may include a water inlet operable to receive water from the water inlet tube 112 via a base assembly inlet passage. The water inlet of the treatment assembly 130 may include a one-way valve or check valve coupled thereto (such as being disposed in line with the water inlet of the treatment vessel 134) to substantially prevent leakage of resident water in the treatment assembly 130 during transport to a maintenance location (e.g., often a water collecting vessel or more commonly the kitchen sink).

The treatment assembly 130 may include a closure assembly 132 with a handle assembly 136 operable to secure the treatment assembly 130 into a pocket provided by the base assembly 110. Operation of the handle assembly 136 from a disengaged position to an engaged position may form a water tight connection between the base assembly 110 and the treatment assembly 130 so that they resist the tendency of the water connections.

In the illustrated embodiment, a preliminary filter of the treatment assembly 130, also described as a pre-stage filter, may provide filtration for particulates disposed in the untreated water received via a treatment assembly inlet. Water flowing through the preliminary filter may be communicated to a downstream filter, such as a filter assembly, which may operate to further treat water that has passed through the preliminary filter. In one embodiment, the preliminary filter may be configured to provide filtration for particulates that, if not removed upstream of the filter assembly, might significantly reduce the usable life of the filter assembly. For instance, the filter assembly may be constructed for filtration of particulates considered to be fine or small for a target flow rate, and the preliminary filter may be constructed for filtration of particulates considered larger (e.g., 30-500 microns) at the target flow rate. Without the preliminary filter, such larger particles might clog or reduce the effective filtration of the filter assembly and its effective life.

The filtration media of the filter assembly may include a carbon block filter operable to adsorb or filter (or both) particulates and contaminants included in the water so that water discharged from the filtration media is considered filtered and ready for downstream disinfection by the UV reactor 200.

The base assembly 110 in accordance with one embodiment includes the upper portion 102, the rear portion 103, the side portion 104, and the base portion 105, as described herein. The base assembly 110 is operable to removably couple to the treatment assembly 130, such as by facilitating formation of a watertight seal between a water supply connector and a treatment assembly coupling and between a treatment assembly outlet and a treatment assembly connector of the base assembly 110. In one embodiment, the base assembly 110 may include a main body that provides a demountable structure to hold and connect the treatment assembly 130.

The base assembly 110 in the illustrated embodiment includes a cover 310 that can be removed from a frame assembly 313 of the base assembly 110 to expose internal components 312 of the base assembly 110, including, for example a sensor unit 316 (e.g., a flow sensor) and a control system 318. The frame assembly 313 may provide the structural core of the water treatment system 100, providing a platform for positioning a set of assemblies, which may be modularized, and which may facilitate one or more aspects of treating water for consumption. This configuration may enable continued evolution of the water treatment system 100 (e.g., changes to components of the water treatment system such as the display or control unit) while keeping substantially the same form factor. Accordingly, the water treatment system 100 can be updated to remain current into the future.

The base assembly 110 may include a display unit 314 having a display 315, which can provide visual feedback to a user regarding operation of the water treatment system 100. In the illustrated embodiment, the cover 310 conceals the display 315 as well as the display unit 314. Alternatively, the display 315 and the cover 310 may be constructed such that the display 315 is partially or completely concealed by the cover 310.

A lens 311 may be optically coupled between the display 315 and an external area of the water treatment system 100 to enable optical communication with respect to the display 315 and the external area.

The base assembly 110 may include a pedestal or base portion 105 operable to stabilize the base assembly 110 on a horizontal surface, such as a countertop or within a cabinet. The base portion 105 may be constructed with a perimeter edge that contacts the horizontal surface while supporting the frame assembly 313 in a spaced relationship relative to the horizontal surface, such that, to the extent water or other elements become present on the horizontal surface, the frame assembly 313 may remain spaced above such water or other elements. The base portion 105 may include one or more access points operable to receive the water inlet tube 112 and water outlet tube 114 for connection respectively to the water supply inlet and the treated water outlet.

The control system 318 in the illustrated embodiment may include circuitry configured to direct operation of the water treatment system 100, including directing the display unit 314 to provide visual feedback to a user, and including receiving sensor information obtained from the sensor unit 316. As described herein, the control system 318 may also be operable to direct operation of the UV reactor 200 to disinfect the water discharged from the treatment assembly 130 and to discharge the treated water to the treated water outlet 360. Water discharged from the UV reactor 200 may flow through the sensor unit 316 to the treated water outlet 360, which is in fluid communication with the water outlet tube 114.

In the illustrated embodiment, internal components of the base assembly 110, such as wet and electrical unit assemblies, mounted on the frame assembly 313 may be covered by a rear cover assembly (e.g., the cover 310) that may provide aesthetic look and feel, potentially protect the internal components, and accommodate light conducting structures that provide a system health indication as an extension of the display unit 314.

The base portion 105 (e.g., a base pedestal part) maybe secured to the unit body assembly to provide aesthetic, plumbing management, and stabilizing, structural, or protective accommodations to assist the desired positioning means.

The internal components of the base assembly 110 may include, as discussed herein, a display unit 314, a control system 318, a sensor unit 316, and a UV reactor 200. In the illustrated embodiment, the UV reactor 200 includes a UV reactor inlet 232 that is provided in fluid communication with the treated water outlet 360 to receive water discharged from the treatment assembly 130. The UV reactor 200 may be operable to supply UV energy to water received via the UV reactor inlet 232 in order to disinfect the water. Disinfected water may be discharged or output via the UV reactor outlet 230, which is in fluid communication with a water inlet 385 of the sensor unit 316.

In the illustrated embodiment, the components include an RFID communicator or wireless communication circuitry 390, which may be capable of communicating wirelessly with one or more components external to the base assembly 110. As an example, the wireless communication circuitry 390 may communicate with the RFID component (e.g., an RFID tag) provided in the filter assembly.

In one embodiment, the wireless communication circuitry 390 may include an RFID antenna that is attached to the frame assembly 313 proximate to the treatment assembly 130 in an installed position, and is connected to the control system 318 (or main electronics) by a detachable tether.

The electrical and control system is not limited to the system described in conjunction with the illustrated embodiment of the water treatment system 100; it is to be understood that the electrical control system may be updated, replaced, or substituted for other technical systems as determined, independent of other system components.

The water path components (e.g., the sensor unit 316 and UV reactor 200) of the base assembly 110 may be arranged and secured to the frame assembly 313. The sensor unit 316 may monitor and measure water flow. Additionally, or alternatively, the sensor unit 316 may measure water temperature.

The control system 318 in one embodiment may be directly plugged into or connected to the UV reactor 200 after connections to the control system 318 have been established between the wireless communication circuitry 390, the display unit 314, and any sensors (e.g., the sensor unit 316). The connection to the UV reactor 200 may be formed via a connection panel on the underside of the control system 318. The connection panel may also provide connectors for the wireless communication circuitry 390, the display unit 314, and any sensors. The connection panel being disposed on the underside of the control system 318 may facilitate hiding the connections from casual view to improve the overall aesthetic of the assembly and to substantially shield the electronic connections from any casual water splashing.

II. UV Reactor

A UV reactor in one embodiment according to the present disclosure is shown in FIGS. 7-15 and is generally designated 200. The UV reactor 200 in the illustrated embodiment includes a UV reactor inlet 232 and a UV reactor outlet 230. The UV reactor 200 may include one or more of the following components:

- a reactor body 201;
- an end cap 202 having at least one outlet in fluid communication with the UV reactor outlet 230;
- a UV transmissive window 205;
- a water facing thermal coupler 406;
- a first seal 210 disposed at least between the water facing thermal coupler 406 and the end cap 202 to substantially prevent leakage across the seal interface between the water facing thermal coupler 406 and the end cap 202;
- a second seal 203 disposed between the water facing thermal coupler 406 and the UV transmissive window 205 to substantially prevent leakage across the seal interface between the second seal 203 and the UV transmissive window 205;
- a UV source assembly 400 having one or more UV sources 402 as described herein;
- a support cap 209 disposed and configured to interface with the end cap 202 and operable to hold in place the UV source assembly 400, the first and second seals 210, 203, the UV transmissive window 205, and the water facing thermal coupler 406;
- reactor body support 211 operable to hold the reactor body 201 in order to facilitate formation of the water treatment chamber 245;
- a flow element 216 disposable within the water treatment chamber 245 to affect flow of water depending on the application (e.g., to generate laminar flow); and
- fasteners 214 operable to interface with the support cap 209, the end cap 202, and the reactor body support 211 to maintain a water tight seal within the water treatment chamber 245 from the UV reactor inlet 232 to the UV reactor outlet 230.

In the illustrated embodiment, the reactor body support 211 and the end cap 202 are joined together in a substantially permanent, leaktight manner. As an example, the reactor body support 211 and the end cap 202 may be spin welded together to form a seal 204. This type of connection between the reactor body support 211 and the end cap 202 may provide a leaktight connection without the use of a removable seal—although such a removable seal may be incorporated into an alternative embodiment of the UV reactor 200.

The UV reactor 200 may be configured such that water enters the UV reactor inlet 232, defined at least in part by the reactor body support 211. The UV reactor inlet 232 may include a hose barb connector 233 that is coupled to the reactor body support 211 (e.g., via a spin weld) to define at least a portion of the UV reactor inlet 232 to facilitate entry of water into the UV reactor 200 and through the water treatment chamber 245. Water may flow through one or more flow paths provided by the flow element 216 prior to entering the water treatment chamber 245. Water may be discharged from the UV reactor 200 via the UV reactor outlet 230, which may include a hose barb connector 237 that is coupled to the end cap 202 (e.g., via a spin weld) to define at least a portion of the UV reactor outlet 230.

In the illustrated embodiment, the UV reactor inlet 232 and the UV reactor outlet 230 are configured to direct water in directions transverse to the longitudinal axis 240 of the UV reactor 200. This configuration may enable a reduced vertical profile of the UV reactor 200.

The water treatment chamber 245 may include an interior side surface 290 of the reactor body 201 that extends generally from a first end 291 to a second end 292 of the water treatment chamber 245 and the longitudinal axis 240 extending there between. The interior side surface 290 of the water treatment chamber 245 may not define the entirety of the interior surface of the water treatment chamber. For instance, one or more portions of the end cap 202, the reactor body support 211, and the flow element 216 may define one or more portions of the interior surface of the water treatment chamber 245.

Figure 12:
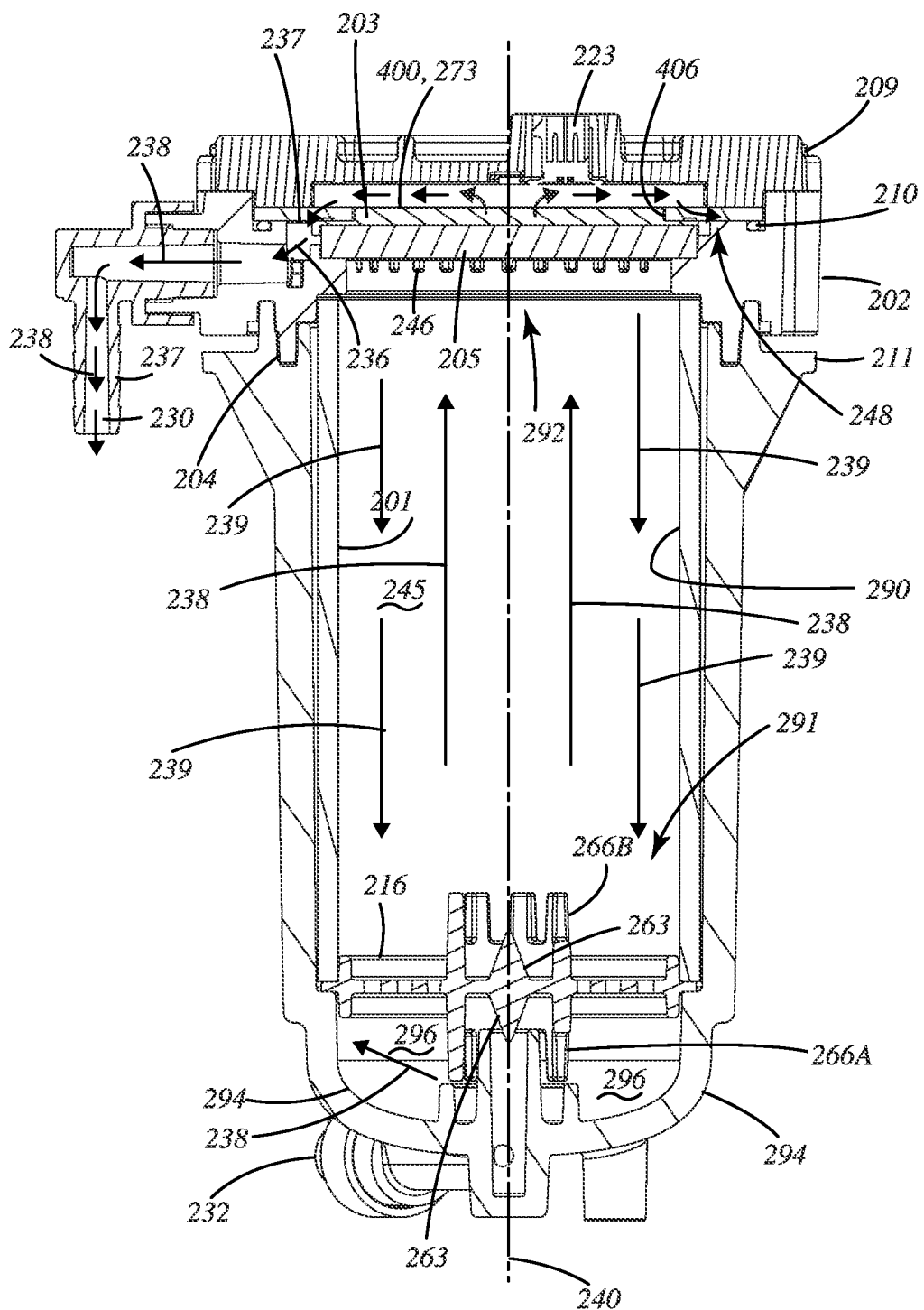
FIG. 12 shows a sectional view of the UV reactor in FIG. 1.
Figure 13:
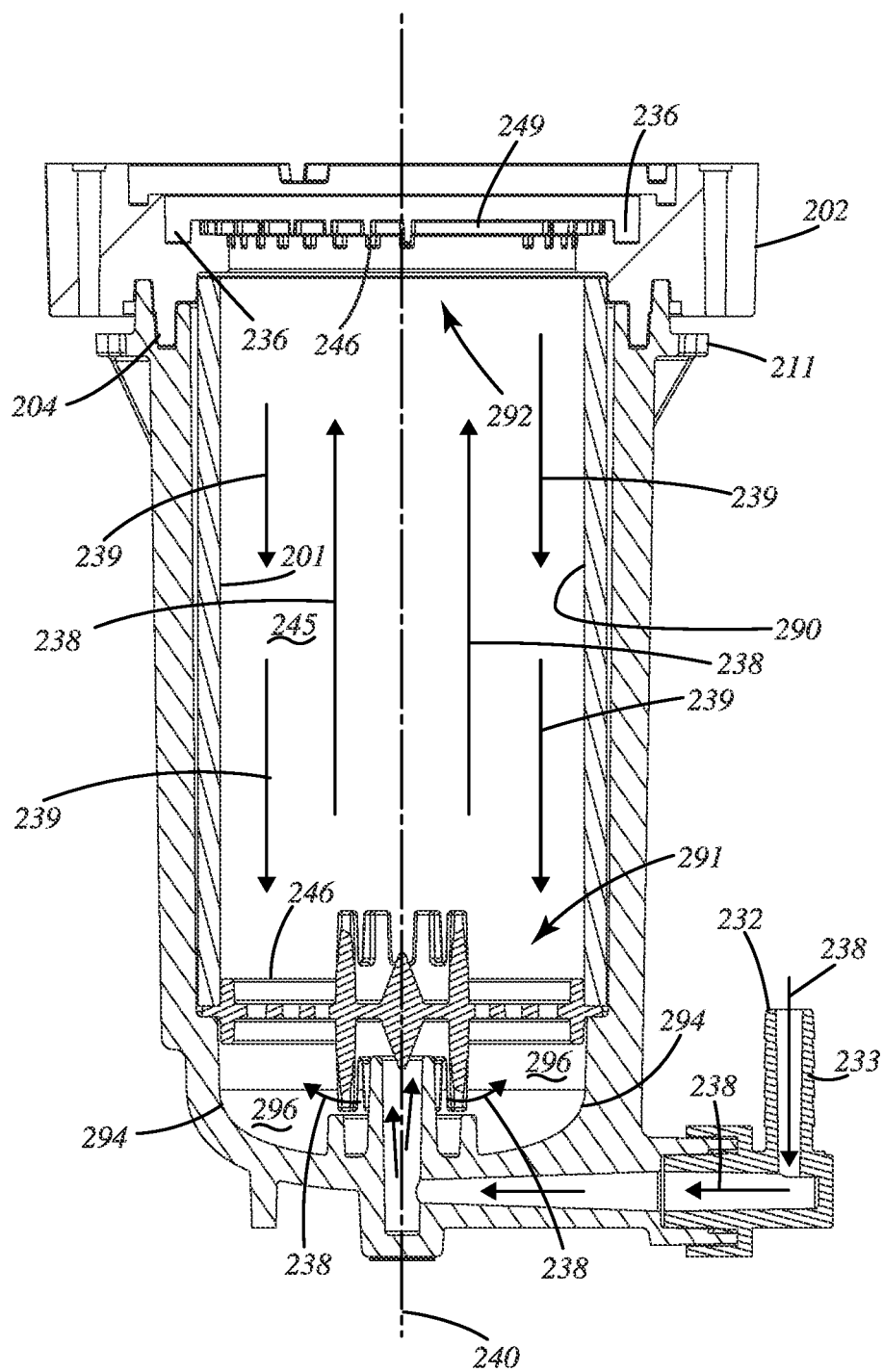
FIG. 13 shows a sectional view of the UV reactor in FIG. 1.
Figure 14:
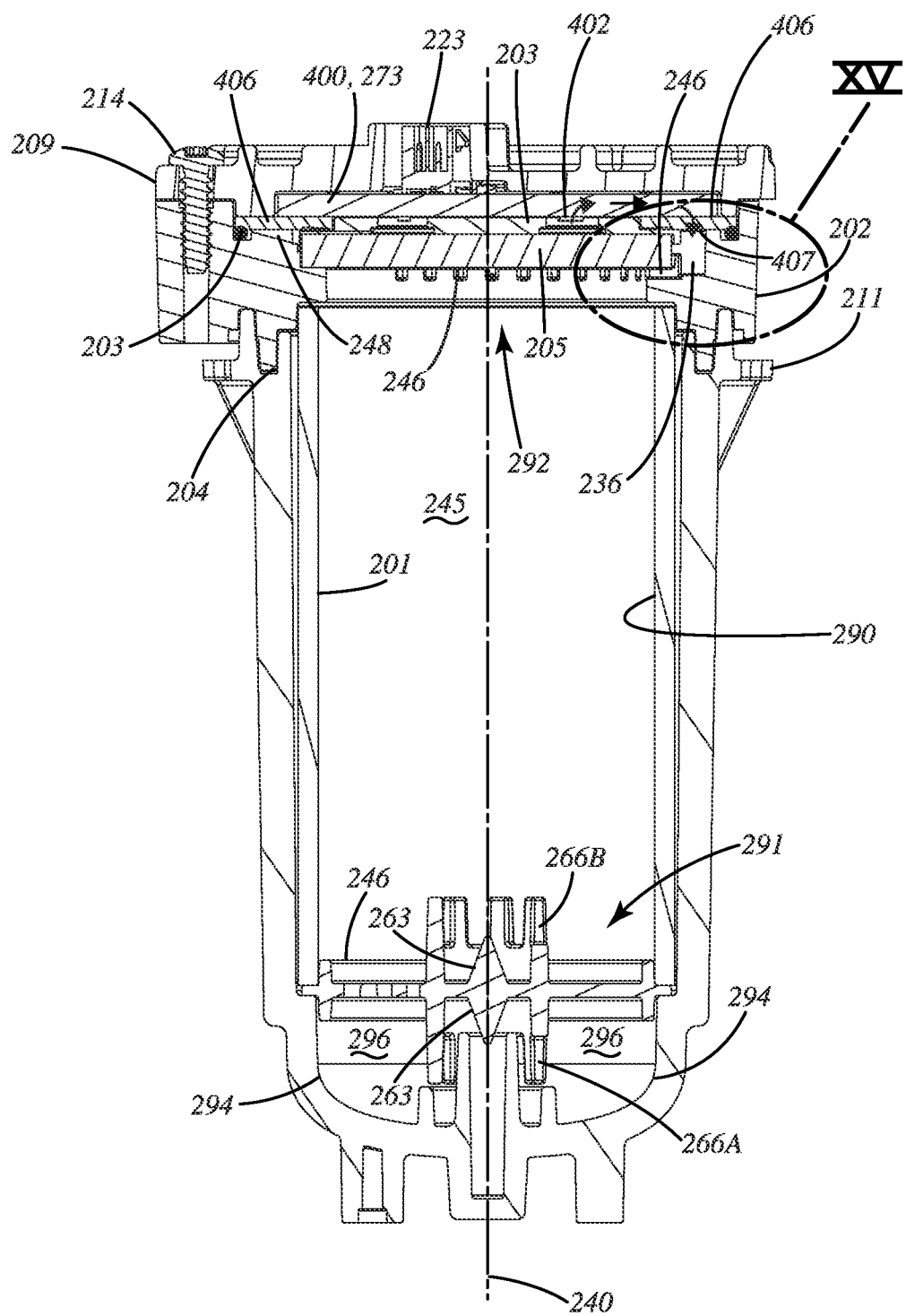
FIG. 14 shows a sectional view of the UV reactor in FIG. 1.

The reactor body 201 may include first and second openings proximal respectively to the first and second ends 291, 292, of the water treatment chamber 245. For instance, the reactor body 201 may be provided in the form of a hollow cylinder with the first and second ends corresponding to the bottom and top of the reactor body 201 as depicted in FIGS. 12-14. However, the reactor body 201 may be any type of cylinder, and is not limited to the cylindrical construction depicted in the illustrated embodiment. For instance, the cross-sectional shape of the reactor body 201 may vary depending on the application, such as being a hexagonal cylinder or octagonal cylinder. As another example, the reactor body 201 may include more than one longitudinal axes, such that the reactor body 201 includes multiple segments having longitudinal axes that are not co-linear.

The reactor body 201 may be constructed of one or more materials depending on the application. For instance, the reactor body 201 may include first and second materials arranged in a concentric relationship, such as a first material forming a sleeve about a second inner material, the surface of which contacts water as it flows through the water treatment chamber 245. As another example, the reactor body 201 may be formed entirely of a UV reflective material, such as PTFE or ePTFE. Reflection of UV light within the water treatment chamber 245 of the reactor body 201 may facilitate maintaining intensity of the UV light there within and substantially block UV light from leaking outside the water treatment chamber 245.

In the illustrated embodiment, the UV source assembly 400 may be disposed proximal to the second end 292 of the water treatment chamber 245. The UV source assembly 400 may include a printed circuit board (PCB) assembly 480 and may be configured to direct UV light into the water treatment chamber 245 through the UV transmissive window 205, which may be formed of quartz. The UV source assembly 400, as described herein, may include the PCB assembly 480 and a UV source arrangement that includes a plurality of UV sources 402, which may be UV LEDs. The UV source assembly 400 may include a connector 223 configured to enable supply of power to circuitry of the UV source assembly 400.

In use, within the water treatment chamber 245, with the UV reactor 200 positioned vertically as shown in FIGS. 7-15, water flows up toward the UV sources 402 of the PCB assembly 480 of the UV source assembly 400 and then out of the water treatment chamber 245 through at least one outlet path defined at least in part by the end cap 202. The at least one outlet path may be fluidly coupled to the UV reactor outlet 230 for discharge of treated water from the UV reactor 200. The at least one outlet path may include a plurality of chamber outlets 246, shown in further detail in the illustrated embodiments of FIGS. 10-11. The plurality of chamber outlets 246 may be fluidly coupled to a thermal exchange region 236, described herein as a trough or cooling chamber, in which water thermally conducts heat energy away from the water facing thermal coupler 406 before exiting through the UV reactor outlet 230, as depicted in FIGS. 12 and 14 with the heat designed by dashed arrows.

The plurality of chamber outlets 246 may be defined at least in part by a plurality of respective apertures in the interior side surface 290 of the water treatment chamber 245, enabling water to be discharged in a radial manner relative to the longitudinal axis 240 of the water treatment chamber 245. More specifically, the plurality of chamber outlets 246 may be defined by respective channels provided in the end cap 202 and a portion of a chamber facing surface of the UV transmissive window 205. The plurality of chamber outlets 246 may be configured differently as described in conjunction with the plurality of chamber outlets 246.

In the illustrated embodiment of the UV reactor 200, a flow path defined by the plurality of chamber outlets 246 may be formed adjacent to the second end 292 of the end cap 202. The plurality of chamber outlets 246 may lead to a collection trough or thermal exchange region 236 in fluid communication with the UV reactor outlet 230 provided by the end cap 202. The collection trough or thermal exchange region 236 may extend around a portion of or an entirety of an inner circumference of the end cap 202 as depicted in the illustrated embodiment of FIGS. 10-11.

In the illustrated embodiment of FIGS. 1 and 7-15, the UV source assembly 400 is thermally coupled to the water facing thermal coupler 406, which may be metal, such as steel, aluminum, or copper. The water facing thermal coupler 406 may operate as a heat sink drawing thermal energy from the UV source assembly 400 and facilitating transfer of that energy to one or more other mediums, such as ultimately to the water traversing through the UV reactor outlet 230. The UV source assembly 400 may include a thermal contact region 440 that is thermally coupled to or in direct thermal contact with the water facing thermal coupler 406. In one embodiment, a thermally conductive intermediate material (e.g., a thermal paste, thermal grease, or thermal compound) may be provided between the thermal contact region 440 and the water facing thermal coupler 406.

The UV source assembly 400 may include an integral source-based thermal coupler, which may be thermally coupled to the water facing thermal coupler 406. As an example, the source-based thermal coupler and the water facing thermal coupler 406 may be in contact with each other such that water flowing through the thermal exchange region 236 may absorb heat from the UV source assembly 400. This may allow water flowing through the collection trough or thermal exchange region 236 to cool the water facing thermal coupler 406 thereby cooling the source-based thermal coupler and the one or more UV sources 402 of the UV source assembly 400.

The UV reactor 200, in the illustrated embodiment, may include the flow element 216 disposed to form a first end of the water treatment chamber 245. The flow element 216, in one embodiment, may be a baffle to facilitate formation of laminar flow from the first end 291 to the second end 292. The flow element 216 may include a plurality of fluid pathways that communicate fluid received by the UV reactor inlet 232 to the water treatment chamber 245. The UV reactor 200 may include a flow director or deflector 266, optionally integrated with the flow element 216, to facilitate generation of turbulent water flow in proximity to the plurality of fluid pathways of the flow element 216 on a side opposite the water treatment chamber 245.

In the illustrated embodiment, the UV source assembly 400 is spaced apart from the UV transmissive window 205. As described herein, the second seal 203 may be configured as a spacer operable to fill at least a portion of or a substantial amount of the space between the UV source assembly 400 and the UV transmissive window 205. By filling this space, which may otherwise include air or another gas, the second seal 203 may reduce the amount of air or other gas within the space.

As described herein, the second seal 203 may include a plurality of openings 213 corresponding to each of the plurality of UV sources (e.g., UV LEDs) of the UV source assembly 400, allowing light from the UV sources to enter the water treatment chamber 245 via the UV transmissive window 205. The second seal 203 may include an alignment feature operable to angularly align the second seal 203 with respect to the UV source assembly 400 and the UV sources 402 disposed on the UV source assembly 400, enabling light to be directed from the UV source assembly 400 to the UV transmissive window 205 and into the water treatment chamber 245.

In the illustrated embodiment, the second seal 203 is made of a silicone-based material. However, it is to be understood that the present disclosure is not so limited. The second seal 203 may be made of any type of material or combination of materials. For instance, the second seal 203 may be formed of a first material and a second material different from the first material.

The UV reactor 200, including the water treatment chamber 245, may be constructed in a variety of ways as described herein. Additional example constructions are described in U.S. Pub. 2021/0032127, entitled WATER TREATMENT SYSTEM, published Feb. 4, 2021, to Wu et al.—the disclosure of which is hereby incorporated by reference in its entirety.

III. Water Treatment Chamber Materials

The water treatment chamber 245 in the illustrated embodiments of FIGS. 7-15 may be constructed in a variety of ways, using a variety of materials. The materials that form the water treatment chamber 245 may provide surfaces that are UV reflective. The entire interior surface of the water treatment chamber 245 may be reflective with respect to UV light, or portions of the interior surfaces may be reflective with respect to UV light.

A UV reflective surface can be positioned to reflect UV radiation back toward the water to be purified, to enhance the level of UV radiation within the water sample or to make more efficient use of the UV radiation generated by the source of UV radiation. Compositions to provide a target level of UV reflectance for use in water treatment systems may be utilized. In the illustrated embodiments, compositions may be provided that are suitable for direct contact with water to be purified.

Figure 10:
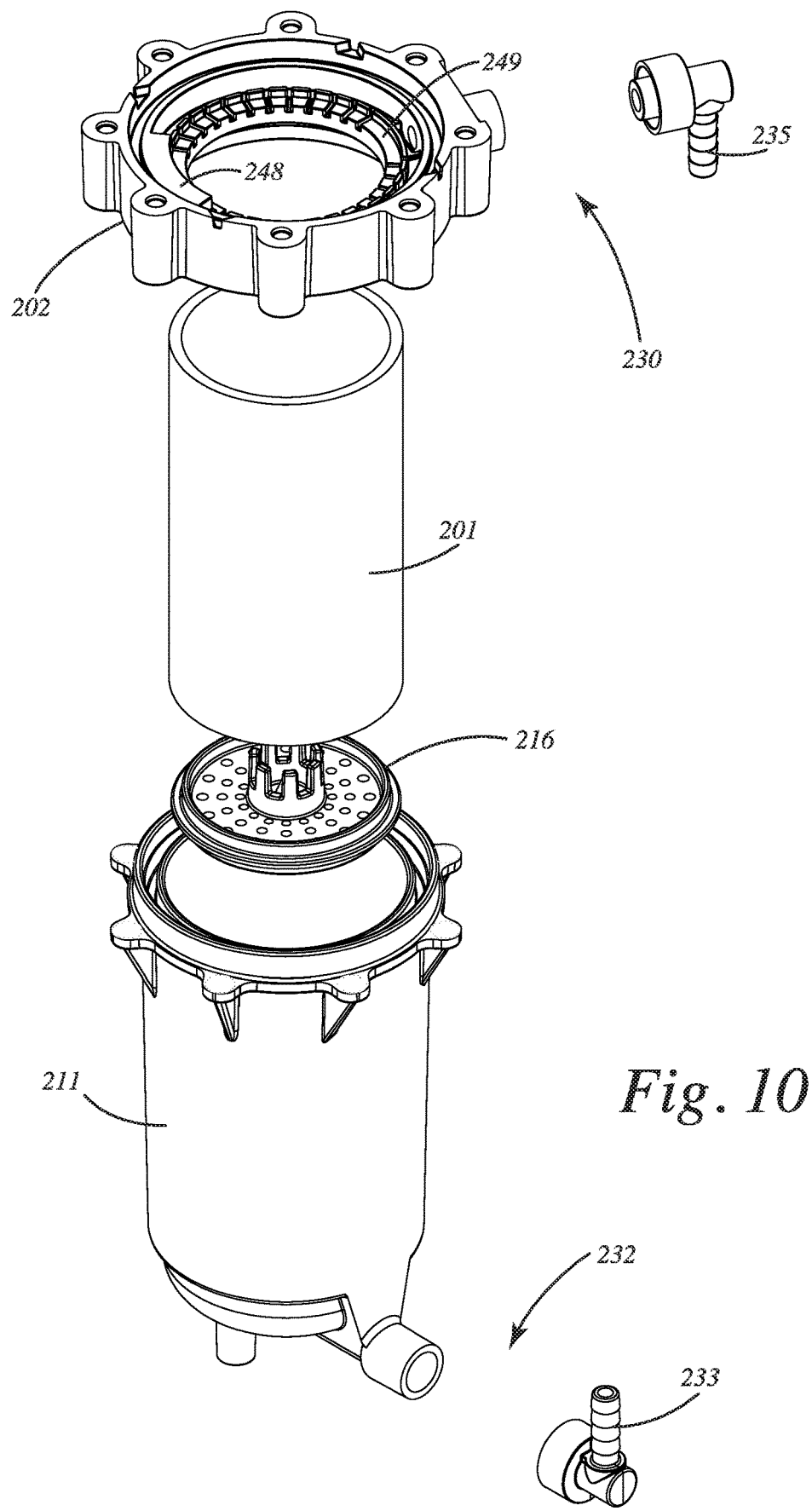
FIG. 10 shows a partial exploded view of the UV reactor in FIG. 1.
Figure 11:
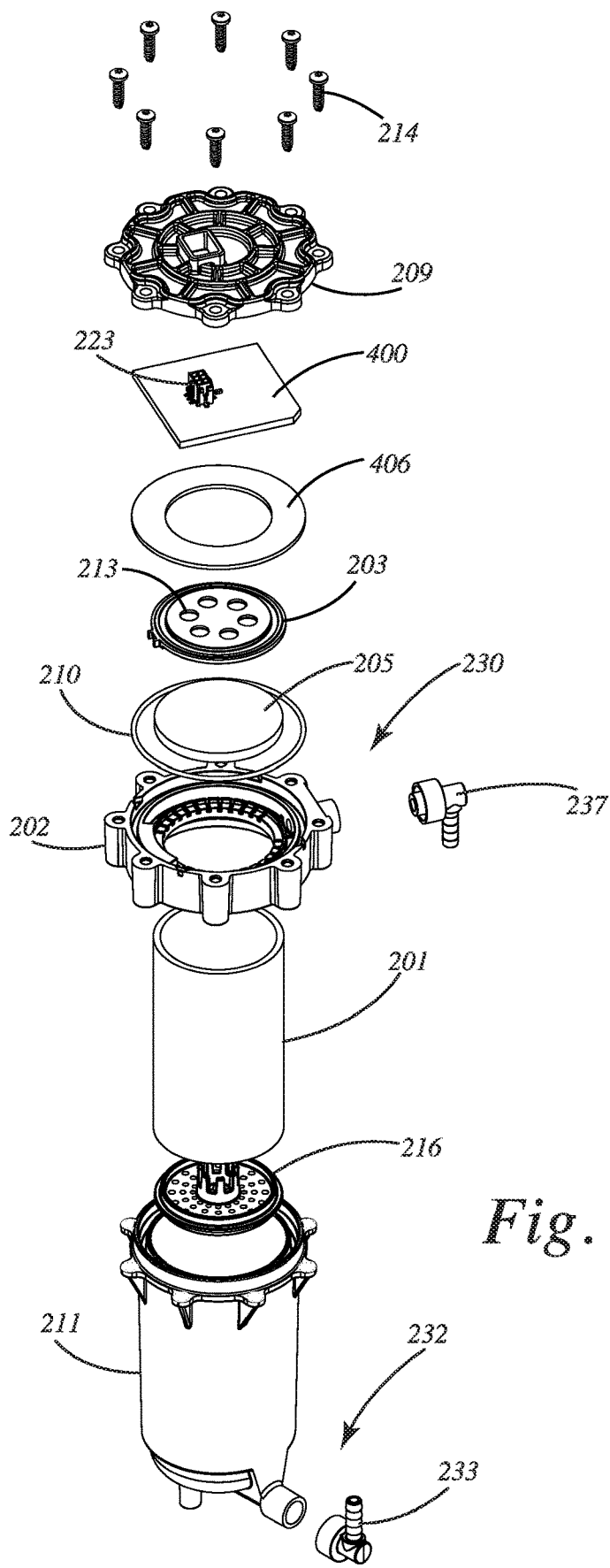
FIG. 11 shows an exploded view of the UV reactor in FIG. 1.

For instance, as depicted in the illustrated embodiment of FIG. 10, the water treatment chamber 245 may include a reactor body 201 and a flow element 216 constructed of a diffusive reflective material, such as PTFE, which provides a reflectivity of at least 80%-90%. The diffusive reflective material may facilitate reflection of light or other waves or particles from a surface such that a ray incident on the surface is scattered at many angles (rather than at just one angle as in the case of specular reflection).

As another example, the water treatment chamber 245 may be constructed in part of a quartz tube, potentially pure quartz, and stainless steel that forms a sleeve about the quartz tube. Alternatively, the stainless steel sleeve may be replaced with a PTFE sleeve disposed about the quartz tube.

In an alternative embodiment, one or both of the components defining the internal surfaces of the water treatment chamber 245 may be coated to facilitate reflection of UV light within the water treatment chamber 245. For instance, in the illustrated embodiment of FIG. 9, the reactor body 201 may be metal coated quartz (e.g., aluminum oxide coated quartz). The coating on one or more of the components may be disposed to define an internal surface of the water treatment chamber 245. Additionally, or alternatively, the coating on one or more of the components may be disposed on a surface of the component opposite a surface of the component that defines a portion of the internal surface of the water treatment chamber 245. To provide an example, the metal coated quartz used for the reactor body 201 in the illustrated embodiment may be coated on its outside surface such that the internal surface of the quartz tube is in direct contact with water provided in the water treatment chamber 245. A coating applied to a component that defines at least a portion of an internal surface of the water treatment chamber 245 may be internal to the component, such as in the case of the component being formed of two or more laminated materials, one or more of which may be coated on one or both sides.

The flow element 216, in one embodiment, may be formed or provided with a reflective material. For instance, the reflective material may be disposed on or coating a substrate component of the flow element 216.

The UV transmissive window 205 that forms at least a portion of an internal surface of the water treatment chamber 245, in one embodiment, may be configured to allow UV light into the water treatment chamber 245 but to reflect light internally within the water treatment chamber 245.

With reflective components provided in assembly of the water treatment chamber 245, UV light intensity within the water treatment chamber 245 can be maintained efficiently at significant levels.

IV. Water Flow Path and UV Light Path

As discussed herein, the UV reactor 200 may be configured to utilize the water flowing through the UV reactor 200 as a medium for cooling the UV sources 402 that substantially disinfect the water. In the illustrated embodiment of FIGS. 7-16, the water flow path 238 is shown from the UV reactor inlet 232 to the UV reactor outlet 230 with the UV light path 239 within the water treatment chamber 245.

The flow element 216 is provided within the flow path of water within the UV reactor 200 to direct flow of water downstream of the flow element 216 and within the water treatment chamber 245 within a UV light path 239. The UV light path 239 and the intensity thereof may be a function of the number and placement of the UV sources 402 with respect to the UV transmissive window 205 and the UV source assembly 400.

For instance, the UV sources 402 may be placed near the middle (or within 20% range of middle) of the radius of the reactor body 201. In other words, the UV sources 402 may be substantially disposed at a radius 405 that is 0.5 times the radius of the reactor body 201.

In one embodiment, the UV sources 402 may be disposed uniformly (e.g., an evenly spaced pattern) about the radius 405. This configuration, in one embodiment, may provide an optimized disinfection configuration. In one embodiment, changing the position of the UV sources 402 relative to the radius 405 may affect performance. For instance, the UV sources 402 may be placed directly in the center of the UV source assembly 400.

In the illustrated embodiment, the UV reactor 200 includes a deflector 266A, 266B provided in the water flow path 238 upstream of the water treatment chamber 245 to generate turbulence flow within a turbulent flow region 296 prior to flowing through the flow element 216. The deflector 266A, 266B, in one embodiment as discussed herein, may include a projection 263 operably positioned directly within the flow path of water passing through the UV reactor inlet 232 to facilitate changing the direction of flow in a turbulent manner, and one or more vents peripherally disposed about the projection 263 to facilitate directing water in a turbulent manner into the turbulent flow region 296. The turbulent flow region 296 may be defined in part by the curved wall 294 to further enhance turbulence within the turbulent flow region 296.

By providing a turbulent flow of water within the turbulent flow region 296 directly upstream of the flow element 216, water is more evenly distributed across the flow paths of the flow element 216. As a result, the flow rate of the water flowing within the water treatment chamber 245 may be distributed more evenly.

In one embodiment, the flow element 216 may be constructed to substantially prevent regions of high flow velocity within the water treatment chamber 245, particularly proximal to the UV transmissive window 205. Such high flow velocity regions may reduce the exposure time for any microorganisms present in the water flowing through the region.

Turning to the illustrated embodiment of FIGS. 7-15, the water flow path 238 includes water flowing through a plurality of chamber outlets 246 into a thermal exchange region 236 and then to the UV reactor outlet 230. The thermal exchange region 236 may be annular and surround the second end 292 of the water treatment chamber 245, as discussed herein.

The thermal exchange region 236 may provide the water flow path 238 in direct contact with the water facing thermal coupler 406, which in turn is thermally coupled to the thermal contact region 440 of the UV source assembly 400. The UV source assembly 400 is configured as discussed herein to facilitate heat flow from the UV sources 402 to the water facing thermal coupler 406 and ultimately to the water flowing through the thermal exchange region 236. This heat flow path is designated by dashed arrows in the illustrated embodiment of FIGS. 12 and 14 that lead from the UV sources 402 to the thermal exchange region 236 and out the UV reactor outlet 230.

In the illustrated embodiment, the heat flow path proceeds as follows: rear-side or back of the plurality of UV sources 402; a thermal component (e.g., metal cladding) of the UV source assembly 400; the water facing thermal coupler 406, such as a support ring for the UV transmissive window 205, that can be stainless-steel or "lead free" brass for direct water contact without substantial leaching of toxic substances into water); and the thermal exchange region 236 also described as a water outlet collection trough.

In one embodiment, the heat flow path proceeds as follows: rear-side or back of the plurality of UV sources 402; a thermal component (e.g., metal cladding) of the UV source assembly 400; thermal paste (or pad or adhesive); a source-side thermal coupler (e.g., a PCB assembly back support [such as, aluminum or copper or thermal plastic]); the water facing thermal coupler 406, such as a support ring for the UV transmissive window 205, that can be stainless-steel or "lead free" brass for direct water contact without substantial leaching of toxic substances into water); and the thermal exchange region 236 also described as a water outlet collection trough.

Optionally, heat may be dissipated from the plurality of UV sources 402 via a convection cooling pathway. The convection cooling pathway for heat proceeds as follows in accordance with one embodiment: the rear-side or back of each of the plurality of UV sources 402; a thermal component (e.g., metal cladding) of the UV source assembly 400; thermal paste (or pad or adhesive); a source-side thermal coupler; and the air or environment via the thermal paths.

A UV source assembly 400 in one embodiment is configured such that a source-based thermal coupler is integrally provided in the UV source assembly 400. The source-based thermal coupler may include a copper layer, which may be a heat conductive layer operable to conduct heat from the plurality of UV sources 402 to a water facing thermal coupler 406. It is to be understood that the copper layer may be formed of any type of material or multiple materials operable to provide a heat conducive layer to facilitate conduction of heat from the plurality of UV sources 402 to the water facing thermal coupler 406.

V. UV Source Assembly

Figure 16:
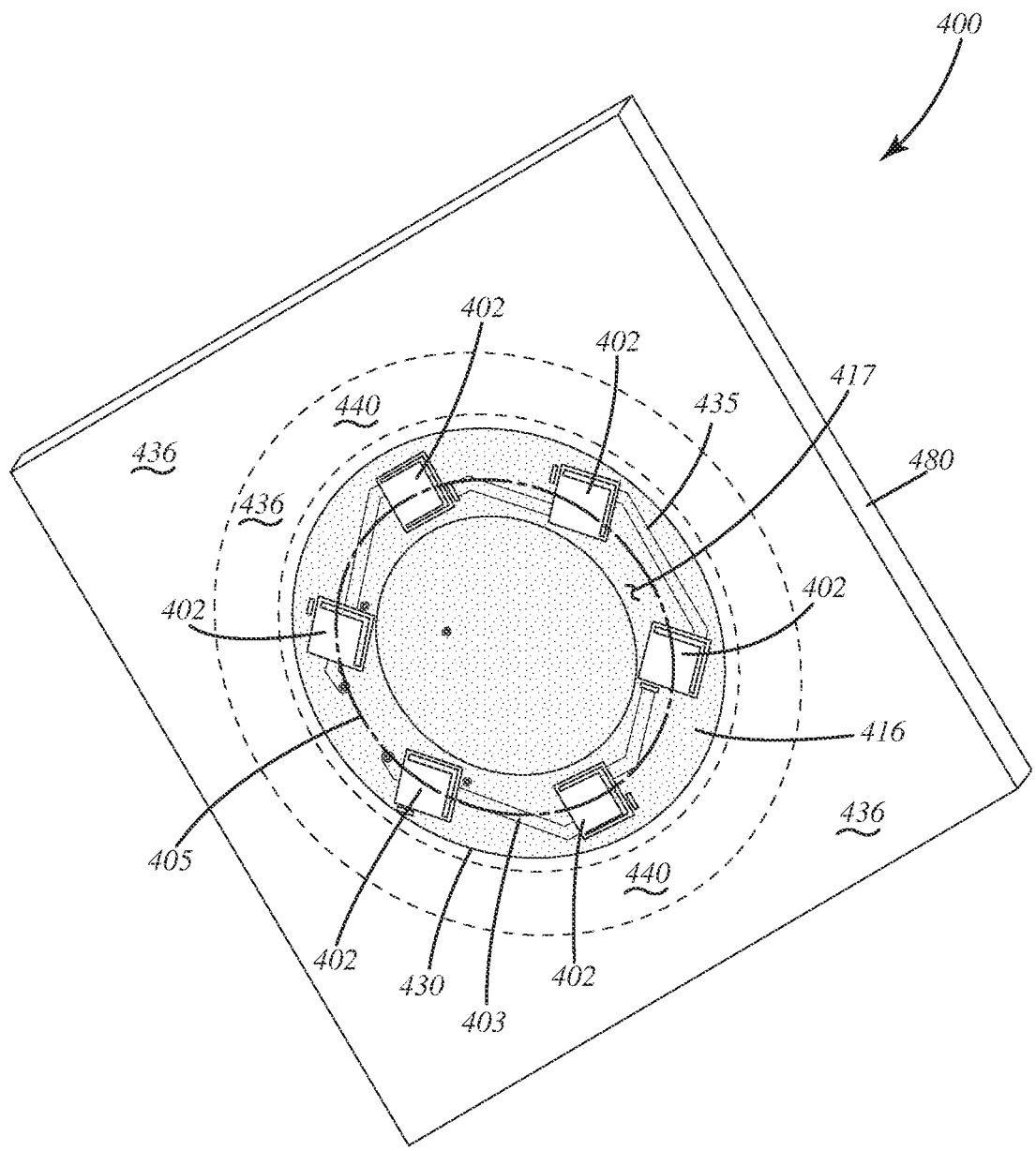
FIG. 16 shows printed circuit board assembly in one embodiment according to the present disclosure.

The UV source assembly 400 in one embodiment according to the present disclosure is depicted in FIGS. 1 and 16. The UV source assembly 400 is depicted with water facing thermal coupler 406, which is a heat sink in the illustrated embodiment that is in thermal contact with the thermal contact region 440 of the UV source assembly 400. The water facing thermal coupler 406 includes a water contact region 407 configured to contact water flowing through the thermal exchange region 236 of the UV reactor 200. The water facing thermal coupler 406 may conduct heat energy to the water via the water contact region 407, which in the illustrated embodiment, may form at least a portion of a water flow path for water flowing through the UV reactor 200.

The UV source assembly 400 and illustrated embodiment of FIG. 1 is depicted with a single UV source 402 disposed on a printed circuit board assembly 480; however, it is to be understood that the UV source assembly 400 may include a plurality of UV sources 402 as shown in the illustrated embodiment of FIG. 16. The UV source 402 includes an electrical terminal 403 that may be soldered to a circuit region 435 of the UV source assembly 400. The UV source 402 may include a thermal contact that can be thermally coupled to a conductive layer 414 or the core layer 410, or any other conductive layer of the UV source assembly 400. The thermal contact may be shared with an electrical contact of the UV source 402, e.g., such that the electrical terminal 403 may provide an electrical connection to the circuit region 435 of the printed circuit board assembly 480 and a thermal connection to the conductive layer 414.

Although the UV source 402 is depicted coupled electrically and thermally to the conductive layer 414 in the illustrated embodiment of FIG. 1, it is to be understood that the UV source 402 may be coupled electrically and/or thermally to any conductive layer of the UV source assembly 400, including the core layer 410. For instance, a pad of the UV source 402 may be soldered directly to the core layer 410 for thermal conduction of heat flux, and another pad of the UV source 402 may be coupled to the conductive layer 414 for receipt of an electrical signal (e.g., power). The UV source 402 may be connected to the UV source assembly 400 in a variety of ways, as described herein.

The printed circuit board assembly 480 may include a plurality of layers, some of which may be electrically conductive or electrically insulative and thermally conductive or thermally insulative, in any combination thereof. The printed circuit board assembly 480 may include a circuit region 435 comprising conductive material that electrically connects components, such as the UV sources 402, to other circuitry or components, including external components, such as control circuitry or power supply circuitry, or a combination thereof.

The circuit region 435 of the UV source assembly 400 may include a conductive layer 414, such as a copper layer, that may be covered by a solder mask 416. Areas of the solder mask 416 may be absent to expose areas of the conductive layer 414, such as to enable electrical connection of components to the conductive layer 414 or thermal coupling of components to the conductive layer 414, or both. Although not shown, the UV source assembly 400 may include a silkscreen 417 disposed on the solder mask 416 to provide information with respect to the UV source assembly 400.

The printed circuit board assembly 480 may include a dielectric layer 412 and a thermally conductive layer 410, where the dielectric layer 412 is disposed between the thermally conductive layer 410 and the conductive layer 414. The dielectric layer 412 may be configured as a thermally conductive layer operable to conduct heat energy from the conductive layer 414 to the thermally conductive layer 410. The thermally conductive layer 410 in the illustrated embodiment may be a core layer formed of copper or aluminum and having a thickness substantially greater than a thickness of the conductive layer 414. The thermally conductive layer 410 in conjunction with the dielectric layer 412 and the conductive layer 414 may define a metal clad printed circuit board assembly.

The thermally conductive layer 410 may include the thermal contact region 440, which may be defined by an upper surface 436 of the thermally conductive layer 410 that is exposed or devoid of the dielectric layer 412 and the conductive layer 414. With the water facing thermal coupler 406 in thermal contact with the thermal contact region 440, heat generated by the UV source 402 may traverse through the conductive layer 414 and the dielectric layer 412 to the thermally conductive layer 410, and then to the water facing thermal coupler 406 via the thermal contact region 440.

In the illustrated embodiments, the thermally conductive layer 410 includes the upper surface 436 and a lower surface 438 opposite the upper surface 436.

The printed circuit board assembly 480 may include a lower dielectric layer 422, a lower conductive layer 424, and a lower solder mask 426. The lower dielectric layer 422 may be in contact with at least a portion of the lower surface 438 of the thermally conductive layer 410, with the lower conductive layer 424 disposed on the lower dielectric layer 422 opposite the thermally conductive layer 410. The lower solder mask 426 may did be disposed on the lower conductive layer 424 opposite the lower dielectric layer 422. It is to be understood that the present disclosure is not limited to this configuration; additional or fewer layers may be provided in conjunction with the stack up or construction of the printed circuit board assembly 480. For instance, the lower dielectric layer 422 and the lower conductive layer 424 may be absent.

The circuit region 435 of the printed circuit board assembly 480 is described primarily in conjunction with the conductive layer 414. However, the circuit region 435 may include one or more additional layers of the printed circuit board assembly 480, such as the lower conductive layer 424. Although not depicted in illustrated embodiment of FIG. 1, the printed circuit board assembly 480 may include one or more vias that electrically connect one conductive layer of the printed circuit board assembly 480 to another conductive layer thereof.

The conductive layer 414 or the dielectric layer 412, or both, in the illustrated embodiment may define an edge 430 that is adjacent to the upper surface 436 of the thermally conductive layer 410. The thermally conductive layer 410 may extend from beneath the edge 430 in both directions distally away from the edge 430. The thermal contact region 440 may be disposed proximal to one side of the edge 430, and a portion of the thermally conductive layer 410 on the other side of the edge 430 may be bonded to the dielectric layer 412. With this configuration, at least a portion of the thermally conductive layer 410, including the thermal contact region 440 may be exposed or devoid of at least one of the dielectric layer 412, the conductive layer 414, and a solder mask 416 disposed on the conductive layer 414.

The thickness of the thermally conductive layer 410, corresponding to a thermal mass of the thermally conductive layer 410, may facilitate providing a high thermal conductance between the UV sources 402 and the water facing thermal coupler 406. Thermal conductance of this configuration (e.g., with an increased thermal mass relative to the conductive layer 414) may be substantially greater than an alternative construction in which a heatsink is thermally coupled directly (or via thermal paste) to the conductive layer 414 via a thermal contact region defined by absence of the solder mask 416 on the conductive layer 414. The dielectric layer 412 may be electrically insulative while having a high thermal conductance to facilitate efficient transfer of heat from the conductive layer 414 to the thermally conductive layer 410.

In the illustrated embodiment, the conductive layer 414 may define a plane 432. This plane 432 may intersect the water facing thermal coupler 406 with the water facing thermal coupler 406 thermally coupled to the thermal contact region 440. The plane 432 may intersect the water facing thermal coupler 416 in this configuration merely because both the water facing thermal coupler 406 and the conductive layer 414 are disposed above the upper surface 436 of the thermally conductive layer 410 (as shown in the orientation depicted in illustrated embodiment of FIG. 1.)

Figure 2:
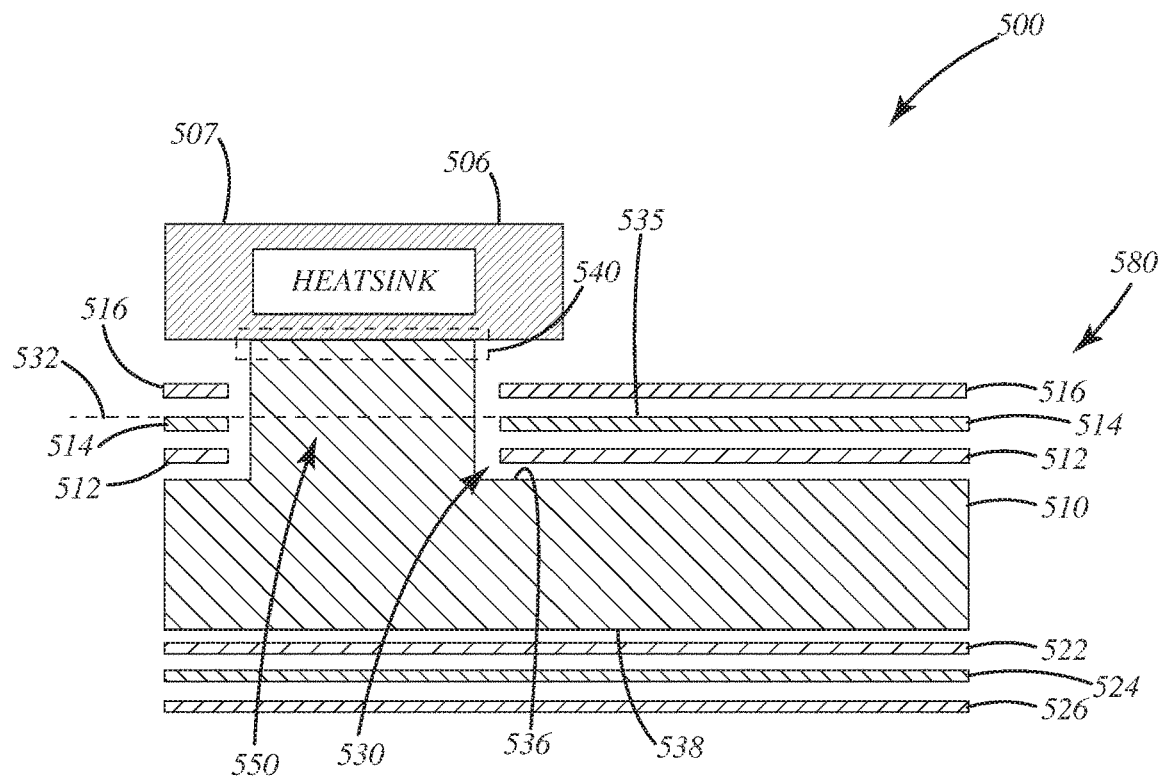
FIG. 2 shows a printed circuit board assembly along with a heat sink in accordance with another embodiment.

An alternative embodiment of a UV source assembly is depicted in FIG. 2 and generally designated 500. The UV source assembly 500 is similar in many respects to the UV source assembly 400 but with several exceptions. The UV source assembly 500 includes a printed circuit board assembly 580, similar to the printed circuit board assembly 480, including a solder mask 516, a conductive layer 514, a dielectric layer 512, a thermally conductive layer 510, a lower dielectric layer 522, a lower conductive layer 524, and a lower solder mask 526 similar respectively in many ways to the solder mask 416, the conductive layer 414, the dielectric layer 412, the thermally conductive layer 410, the lower dielectric layer 422, the lower conductive layer 424, and the lower solder mask 426.

As an example, the conductive layer 514 includes a circuit region 535 similar to the circuit region 435 but shown without the UV source for purposes of disclosure. The conductive layer 514 in the illustrated embodiment may further define a plane 532 similar to the plane 432 described herein.

The thermally conductive layer 510, similar to the thermally conductive layer 410, includes an upper surface 536 and the lower surface 538, as well as a thermal contact region 540. However, the thermally conductive layer 510, in the illustrated embodiment and different from the thermally conductive layer 410, includes an extension 550 that extends from a plane defined by the upper surface 536. The extension 550 may include an upper surface that defines the thermal contact region 540 and may extend from the upper surface 536 of the thermally conductive layer 510 such that the extension intersects the plane 532 defined by the conductive layer 514. The extension 550 may be considered in one embodiment to be a pillar extending from the upper surface 536 of the thermally conductive layer 510.

The extension 550 as well as the thermal contact region 540 may be exposed or devoid of the conductive layer 514 and the dielectric layer 512 such that a water facing thermal coupler 506 may be capable of thermally coupling with the thermal contact region 540. The water facing thermal coupler 506 may be similar to the water facing thermal coupler 406, for example, including a water contact region 507 similar to the water contact region 407.

The printed circuit board assembly 580 in the illustrated embodiment defines an edge 530 that is adjacent to the upper surface 536 of the thermally conductive layer 510. The thermally conductive layer 510 may extend laterally from beneath the edge 530 in both directions distally away from the edge 530.

The extension 550 may be disposed proximal to one side of the edge 530, and a portion of the thermally conductive layer 510 on the other side of the edge 530 may be bonded to the dielectric layer 512. With this configuration, at least a portion of the thermally conductive layer 510, including the extension 550 and the thermal contact region 540 may be exposed or devoid of at least one of the dielectric layer 512, the conductive layer 514, and a solder mask 516 disposed on the conductive layer 514.

The printed circuit board assembly 580 may include one or more layers disposed on opposite sides of the extension 550. For instance, in the illustrated embodiment, the conductive layer 514 and the dielectric layer 512 are disposed on opposite sides of the extension 550. The extension 550 may optionally be surrounded or partially surrounded by the conductive layer 514 and the dielectric layer 512.

Figure 3:
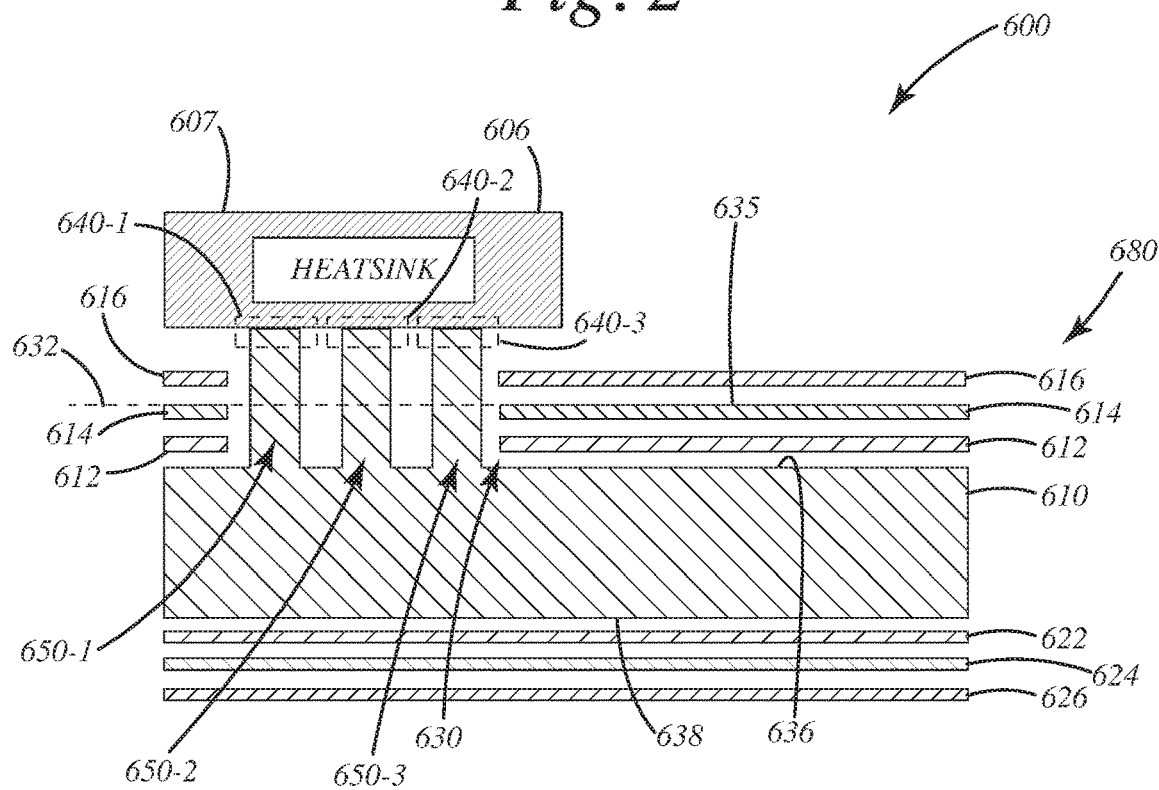
FIG. 3 shows a printed circuit board assembly along with a heat sink in accordance with yet another embodiment.

Another alternative embodiment of a UV source assembly is depicted in FIG. 3 and generally designated 600. The UV source assembly 600 is similar in many respects to the UV source assembly 500 but with several exceptions. The UV source assembly 600 includes a printed circuit board assembly 680, similar to the printed circuit board assembly 580, including a solder mask 616, a conductive layer 614, a dielectric layer 612, a thermally conductive layer 610, a lower dielectric layer 622, a lower conductive layer 624, and a lower solder mask 626 similar respectively in many ways to the solder mask 516, the conductive layer 514, the dielectric layer 512, the thermally conductive layer 510, the lower dielectric layer 522, the lower conductive layer 524, and the lower solder mask 526.

As an example, the conductive layer 614 includes a circuit region 635 similar to the circuit region 535. The conductive layer 614 illustrated embodiment may further define a plane 632 similar to the plane 532 described herein.

The thermally conductive layer 610, similar to the thermally conductive layer 510, includes an upper surface 636 and the lower surface 638. However, the thermally conductive layer 610, in the illustrated embodiment and different from the thermally conductive layer 510, includes multiple extensions 650-1, 650-2, 650-3 that extend from a plane defined by the upper surface 636. The extensions 650-1, 650-2, 650-3 may each include an upper surface. These upper surfaces of the extensions 650-1, 650-2, 650-3 may define the thermal contact regions 640-1, 640-2, 640-2. The plurality of extensions 650-1, 650-2, 650-3 may extend from a plane defined by the upper surface 636 of the thermally conductive layer 610 such that the extension intersects the plane 632 defined by the conductive layer 614. Each of the plurality of extensions 650-1, 650-2, 650-3 may be considered to be a pillar extending from the upper surface 636 of the thermally conductive layer 610.

The plurality of extensions 650-1, 650-2, 650-3 as well as the thermal contact regions 640-1, 640-2, 640-2 may be exposed or devoid of the conductive layer 614 and the dielectric layer 612 such that a water facing thermal coupler 606 may be capable of thermally coupling with the thermal contact regions 640-1, 640-2, 640-3. The water facing thermal coupler 606 may be similar to the water facing thermal coupler 506, for example, including a water contact region 607 similar to the water contact region 507.

The printed circuit board assembly 680 in the illustrated embodiment defines at least one edge 630 that is adjacent to the upper surface 636 of the thermally conductive layer 610. The thermally conductive layer 610 may extend from beneath the edge 630 in laterally both directions distally away from the edge 630. One or more of the extensions 650-1, 650-2, 650-3 may be disposed proximal to an edge defined by the conductive layer 614 and the dielectric layer 612, such as the edge 630 depicted in the illustrated embodiment. A portion of the thermally conductive layer 610 on the other side of such an edge may be bonded to the dielectric layer 612. With this configuration, at least a portion of the thermally conductive layer 610, including plurality of extensions 650-1, 650-2, 650-3 and the thermal contact regions 640-1, 640-2, 640-3 may be exposed or devoid of at least one of the dielectric layer 612, the conductive layer 614, and a solder mask 616 disposed on the conductive layer 614.

The printed circuit board assembly 680 may include one or more layers disposed on opposite sides of the extensions 650-1, 650-2, 650-3. For instance, in the illustrated embodiment, the conductive layer 614 and the dielectric layer 612 are disposed on opposite sides of the extensions 650-1, 650-2, 650-3. The extensions 650-1, 650-2, 650-3 may optionally be surrounded or partially surrounded by the conductive layer 614 and the dielectric layer 612.

VI. Chamber Outlet and Thermal Exchange Region

The UV reactor 200 in accordance with one embodiment includes a plurality of chamber outlets 246 arranged according to a chamber outlet configuration 235, which may vary depending on the application. The chamber outlets 246 may be defined at least in part by an aperture in the interior side surface of the water treatment chamber 245. In one embodiment, the aperture may be disposed directly adjacent to the second end 292 of the water treatment chamber 245 with no portion of the interior side surface 290 being between the aperture and the second end 292, which in the illustrated embodiment of FIGS. 7-15 corresponds to the water facing side of the UV transmissive window 205. In this way, the water flow path 238 is provided such that water travels in a radial path perpendicular to the longitudinal axis 240 of the UV reactor 200 through the aperture into a chamber outlet 246. This flow path can be seen in the illustrated embodiment of FIG. 15, with the water flowing through the water treatment chamber 245 through one of the plurality of chamber outlets 246 into the thermal exchange region 236 and through the UV reactor outlet 230.

The number and configuration of the chamber outlets 246 may vary from application to application. For instance, in the illustrated embodiments of FIGS. 60-61, the chamber outlets 246 may be disposed adjacent to the periphery of the second end 292 of the water treatment chamber 245 and spaced evenly therearound in accordance with a chamber outlet configuration 235. In one embodiment, the plurality of chamber outlets 246 may be radially distributed uniformly about the longitudinal axis 240. However, the present disclosure is not so limited. The plurality of chamber outlets 246 may be disposed in any manner, including a pattern of uneven spacing, and cutoff regions or keepout regions as described herein.

In one embodiment, the total cross-sectional area of the plurality of chamber outlets 246 may be larger than the cross-sectional area of the UV reactor inlet 232 to avoid significant pressure drop, and possibly to minimize pressure drop.

In one embodiment, shown in FIG. 10, a first keepout region 249 for the chamber outlets 246 may be provided proximal to the UV reactor outlet 230. The first keepout region 249, in one embodiment, may facilitate control over the flow of water through the thermal exchange region 236, thereby having an impact on the thermal conduction performance of the UV reactor 200.

In one embodiment, shown in FIG. 10, a second keepout region 248 for the chamber outlets may be provided distal from the UV reactor outlet 230. Similar to the first keepout region 249, the second keepout region 248 may facilitate control over the flow of water through the thermal exchange region 236, thereby having an impact on the thermal conduction performance of the UV reactor 200.

It is to be noted that the second keepout region 248, opposite the UV reactor outlet 230, may be provided with respect to one or more chamber outlets 246 as well as the thermal exchange region 236. For instance, in the illustrated embodiment of the second keepout region 248, there are no chamber outlets in the second keepout region 248 and also there is no flow path available within the thermal exchange region 236 for the second keepout region 248. In other words, the collection trough or thermal exchange region 236 may not fully encircle the water treatment chamber 245, as shown in the illustrated embodiment of FIG. 10. The second keepout region 248 may close off the thermal exchange region 236 for enhanced performance.

It is noted that instead of a second keepout region 248 with respect to the thermal exchange region 236, a partial keepout region may be defined in which the flow path of the thermal exchange region 236 is restricted relative to portions of the thermal exchange region 236 outside of the partial keepout region.

In the illustrated embodiments of FIGS. 7-15, the plurality of chamber outlets 246 are formed, as discussed herein, at least in part by an aperture of an interior side surface of the water treatment chamber 245. The aperture may be defined by a channel in the end cap 202 and a surface of the UV transmissive window 205. The channels in the end cap 202 are depicted in the illustrated embodiments of FIGS. 10-11 and 15. Alternatively, one or more of the plurality of chamber outlets 246 may be defined at least in part by an aperture disposed in the first end 291 of the water treatment chamber 245.

As shown in the illustrated embodiments of FIGS. 12-15, the thermal exchange region 236 is defined by a trough in the end cap 202, the UV transmissive window 205, and the water facing thermal coupler 406. The thermal exchange region 236 may, itself, be considered a collection trough through which water exiting the plurality of chamber outlets 246 may be collected and flow toward the UV reactor outlet 230. The thermal exchange region 236 may be configured to dispose water directly in contact with the water facing thermal coupler 406 for transfer of heat energy. This heat energy may leave with the water as it exits the UV reactor 200 via the UV reactor outlet 230.

In one embodiment, the plurality of chamber outlets 246 around the entire UV transmissive window 205 direct fluid to the thermal exchange region 236 (e.g., the collection trough) and distribute the fluid uniformly for uniform UV optical exposure. The water contacting surface of the UV transmissive window 205 may function as a wall of each chamber outlet 246 so that the chamber outlet 246 is defined by a channel in the end cap 202 and the UV transmissive window 205. Additionally, or alternatively, the water facing thermal coupler 406 may define at least a portion (e.g., a wall) of the chamber outlet 246.

In the illustrated embodiment, the water facing thermal coupler 406 (e.g., a stainless steel cooling ring) functions as a wall of the thermal exchange region 236 of the UV reactor 200, (e.g., the outlet trough of the reactor).

Figure 15:
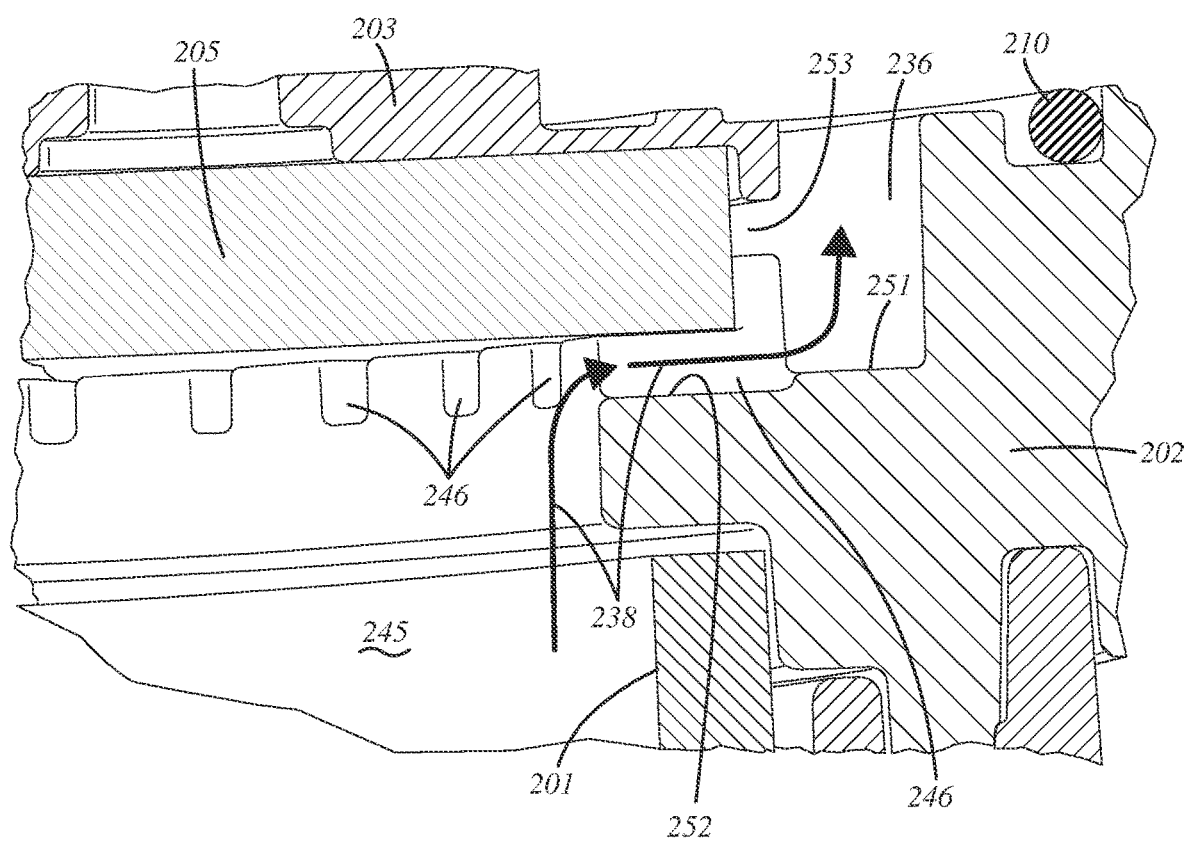
FIG. 15 shows an enlarged view of the sectional view in FIG. 14.

In the illustrated embodiment of FIG. 15, the water flow path 238 for water entering a chamber outlet 246 and into the thermal exchange region 236 is shown in further detail. The chamber outlet 246 in the illustrated embodiment includes a lower surface 252 that defines a plane that does not intersect the thermal exchange region 236—although it is to be understood that the chamber outlet 246 may be configured differently. The thermal exchange region 236 in the illustrated embodiment includes a lower surface 251 that defines a plane that is non-coplanar with respect to the lower surface 252 of the chamber outlet 246, and disposed upward relative to the lower surface 252 in the direction of the water flow path 238. The end cap 202 in the illustrated embodiment includes a plurality of steps that define the walls of the chamber outlets 246 and having an upper surface 253 with a recessed area operable to receive the UV transmissive window 205. The steps in conjunction with the upper surface 253 may help to maintain a position of the UV transmissive window 205.

Directional terms, such as "vertical," "horizontal," "top," "bottom," "upper," "lower," "inner," "inwardly," "outer" and "outwardly," are used to assist in describing the invention based on the orientation of the embodiments shown in the illustrations. The use of directional terms should not be interpreted to limit the invention to any specific orientation(s).

The above description is that of current embodiments of the invention. Various alterations and changes can be made without departing from the spirit and broader aspects of the invention as defined in the appended claims, which are to be interpreted in accordance with the principles of patent law including the doctrine of equivalents. This disclosure is presented for illustrative purposes and should not be interpreted as an exhaustive description of all embodiments of the invention or to limit the scope of the claims to the specific elements illustrated or described in connection with these embodiments. For example, and without limitation, any individual element(s) of the described invention may be replaced by alternative elements that provide substantially similar functionality or otherwise provide adequate operation. This includes, for example, presently known alternative elements, such as those that might be currently known to one skilled in the art, and alternative elements that may be developed in the future, such as those that one skilled in the art might, upon development, recognize as an alternative.

Further, the disclosed embodiments include a plurality of features that are described in concert and that might cooperatively provide a collection of benefits. The present invention is not limited to only those embodiments that include all of these features or that provide all of the stated benefits, except to the extent otherwise expressly set forth in the issued claims. Any reference to claim elements in the singular, for example, using the articles "a," "an," "the" or "said," is not to be construed as limiting the element to the singular. Any reference to claim elements as "at least one of X, Y and Z" is meant to include any one of X, Y or Z individually, and any combination of X, Y and Z, for example, X, Y, Z; X, Y; X, Z; and Y, Z.

The invention claimed is:

1. An ultraviolet (UV) reactor for irradiating a flow of water with UV radiation, the UV reactor comprising:
a treatment assembly including a water inlet and a water outlet, the treatment assembly operable to direct water received via the water inlet toward a point-of-use downstream from the water outlet;
a printed circuit board (PCB) including a solder mask, a first substrate, a heat conducting substrate, and a dielectric disposed between the first substrate and the heat conducting substrate, the first substrate including a first surface with a circuit region, the solder mask being disposed on the first surface of the first substrate;
a UV light emitting diode (UV-LED) operatively connected to the PCB, the UV-LED oriented for directing UV energy into the treatment assembly; and
wherein a thermal contact region of the heat conducting substrate is exposed such that the thermal contact region is devoid of the dielectric, the solder mask, and the first substrate, wherein the thermal contact region is in thermal communication with water flowing through the UV reactor, and wherein at least a portion of the UV-LED is disposed on the first surface of the first substrate.

2. The UV reactor of claim 1 comprising a thermally conductive material including a fluid contact surface arranged to define at least a portion of a fluid path of the water flowing through the UV reactor, the thermally conductive material being thermally coupled to the thermal contact region of the heat conducting substrate to facilitate thermal communication between the water flowing through the UV reactor and the thermal contact region.

3. The UV reactor of claim 2 wherein the thermal contact region is thermally coupled to water flowing through the UV reactor via the thermally conductive material.

4. The UV reactor of claim 2 wherein a thermally conductive intermediate material is provided between the thermal contact region and the thermally conductive material to facilitate thermal communication between water flowing through the UV reactor and the thermal contact region.

5. The UV reactor of claim 2 wherein the fluid contact surface of the thermally conductive material is disposed downstream of the treatment assembly.

6. The UV reactor of claim 1 wherein the PCB is a metal clad printed circuit board.

7. The UV reactor of claim 1 wherein upper and lower surfaces of the heat conducting substrate are entirely devoid of a solder mask.

8. The UV reactor of claim 1 wherein to heat conducting substrate includes an upper surface that defines the thermal contact region.

9. The UV reactor of claim 8 wherein:
an extension of the heat conducting substrate extends from a primary surface of the heat conducting substrate on which the dielectric is disposed;
the extension includes the upper surface; and
a plane of the first substrate intersects the extension.

10. The UV reactor of claim 1 wherein:
the first substrate and the dielectric define a first edge; and
the heat conducting substrate is disposed adjacent to the first edge and extends from both sides of the first edge, such that the thermal contact region is disposed proximal to one side of the first edge and the heat conducting substrate is bonded to the dielectric proximal to the other side of the first edge.

11. The UV reactor of claim 1, wherein the portion of the UV-LED disposed on the first surface of the first substrate corresponds to the terminals of the UV-LED, and wherein at least a portion of the solder mask is provided between the UV-LED and the first surface of the first substrate.

12. A water treatment system for treating water, the water treatment system comprising:
a treatment assembly inlet and a treatment assembly outlet, the treatment assembly inlet operable to receive water and the treatment assembly outlet operable to discharge water from the water treatment system;
a printed circuit board (PCB) including a solder mask, a first substrate, a heat conducting substrate, and a dielectric disposed between the first substrate and the heat conducting substrate, the first substrate including a first surface with a circuit region, the solder mask being disposed on the first surface of the first substrate, a thermal contact region of the heat conducting substrate being exposed such that the thermal contact region is devoid of the dielectric, the solder mask, and the first substrate;
a UV source operably connected to the circuit region of the printed circuit board, at least a portion of the UV source being disposed on the first surface of the first substrate, and the UV source configured to provide UV energy for disinfection of water;
a UV reactor configured to facilitate disinfection of water via application of UV energy to water flowing through the UV reactor, the UV reactor including:
a water inlet operably coupled to the treatment assembly inlet to receive water;
a water outlet for discharging water from the UV reactor;
a water treatment chamber having a first end and a second end, the water treatment chamber having a chamber inlet in fluid communication with the water inlet to receive water to be decontaminated, the water treatment chamber having a chamber outlet operable to direct water toward the water outlet, wherein the UV source is arranged to provide UV energy to the water treatment chamber; and
a cooling chamber in fluid communication with water, the cooling chamber in thermal communication with the thermal contact region of the heat conducting substrate to facilitate transfer of thermal energy from the UV source to water.

13. The water treatment system of claim 12 comprising a thermally conductive material including a fluid contact surface arranged to define at least a portion of a fluid path of the water flowing through the water treatment system, the thermally conductive material being thermally coupled to the thermal contact region of the heat conducting substrate to facilitate thermal communication between water flowing through the water treatment system and the thermal contact region.

14. The water treatment system of claim 13 wherein the thermal contact region is thermally coupled to water flowing through the water treatment system via the thermally conductive material.

15. The water treatment system of claim 13 wherein a thermally conductive intermediate material is provided between the thermal contact region and the thermally conductive material to facilitate thermal communication between water flowing through the UV reactor and the thermal contact region.

16. The water treatment system of claim 13 wherein the fluid contact surface of the thermally conductive material is disposed downstream of the water treatment chamber.

17. The water treatment system of claim 12 wherein the PCB is a metal clad printed circuit board.

18. The water treatment system of claim 12 wherein upper and lower surfaces of the heat conducting substrate are entirely devoid of a solder mask.

19. The water treatment system of claim 12 wherein the heat conducting substrate includes an upper surface that defines the thermal contact region.

20. The water treatment system of claim 19 wherein:
an extension of the heat conducting substrate extends from a primary surface of the heat conducting substrate on which the dielectric is disposed;
the extension includes the upper surface; and
a plane of the first substrate intersects the extension.

21. The water treatment system of claim 12 wherein:
the first substrate and the dielectric define a first edge; and
the heat conducting substrate is disposed adjacent to the first edge and extends from both sides of the first edge, such that the thermal contact region is disposed proximal to one side of the first edge and the heat conducting substrate is bonded to the dielectric proximal to the other side of the first edge.

22. The water treatment system of claim 12, wherein the portion of the UV source disposed on the first surface of the first substrate corresponds to the terminals of the UV source, and wherein at least a portion of the solder mask is provided between the UV source and the first surface of the first substrate.

23. A method of disinfecting water, the method comprising:
providing a treatment assembly including a water inlet and a water outlet;
directing water through the treatment assembly from the water inlet to the water outlet toward a point-of-use downstream from the water outlet;
providing a UV source connected to a circuit region of a printed circuit board (PCB), wherein the PCB includes a solder mask, a first substrate, a heat conducting substrate, and a dielectric disposed between the first substrate and the heat conducting substrate, wherein the first substrate includes a first surface with the circuit region, the solder mask being disposed on the first surface of the first substrate, wherein a thermal contact region of the heat conducting substrate is exposed such that the thermal contact region is devoid of the dielectric, the solder mask, and the first substrate, wherein at least a portion of the UV source is disposed on the first surface of the first substrate;
conducting heat from the UV source to the thermal contact region of the PCB; and
further conducting heat from the thermal contact region of the PCB to water flowing toward the water outlet.

24. The method of claim 23 wherein the PCB is a metal clad printed circuit board.

25. The method of claim 24 comprising supplying UV energy from the UV source to water flowing through the treatment assembly.

26. The method of claim 23, wherein the portion of the UV source disposed on the first surface of the first substrate corresponds to the terminals of the UV source, and wherein at least a portion of the solder mask is provided between the UV source and the first surface of the first substrate.

* * * * *